(12) United States Patent
Akimoto et al.

(10) Patent No.: US 11,961,704 B2
(45) Date of Patent: Apr. 16, 2024

(54) CHARGED PARTICLE BEAM SYSTEM

(71) Applicant: Hitachi High-Tech Corporation, Tokyo (JP)

(72) Inventors: Naoki Akimoto, Tokyo (JP); Takashi Doi, Tokyo (JP); Yuzuru Mochizuki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 378 days.

(21) Appl. No.: 17/595,742

(22) PCT Filed: Jul. 2, 2019

(86) PCT No.: PCT/JP2019/026230
§ 371 (c)(1),
(2) Date: Nov. 23, 2021

(87) PCT Pub. No.: WO2021/001916
PCT Pub. Date: Jan. 7, 2021

(65) Prior Publication Data
US 2022/0223372 A1    Jul. 14, 2022

(51) Int. Cl.
*H01J 37/28* (2006.01)
*H01J 37/09* (2006.01)
*H01J 37/26* (2006.01)

(52) U.S. Cl.
CPC ............ *H01J 37/28* (2013.01); *H01J 37/09* (2013.01); *H01J 37/265* (2013.01); *H01J 2237/057* (2013.01)

(58) Field of Classification Search
CPC .......... H01J 37/28; H01J 37/09; H01J 37/265; H01J 2237/057
(Continued)

(56) References Cited

U.S. PATENT DOCUMENTS

| | | | |
|---|---|---|---|
| 6,555,816 B1* | 4/2003 | Sawahata | H01J 37/141 250/311 |
| 2009/0200457 A1* | 8/2009 | Holle | H01J 49/164 250/281 |

(Continued)

FOREIGN PATENT DOCUMENTS

| | | |
|---|---|---|
| JP | 6-5499 A | 1/1994 |
| JP | 6-163371 A | 6/1994 |

(Continued)

OTHER PUBLICATIONS

International Search Report (PCT/ISA/210) issued in PCT Application No. PCT/JP2019/026230 dated Sep. 24, 2019 with English translation (five (5) pages).

(Continued)

*Primary Examiner* — Nicole M Ippolito
(74) *Attorney, Agent, or Firm* — Crowell & Moring LLP

(57) ABSTRACT

There is provided a charged particle beam system having a computer system for controlling an acceleration voltage of a charged particle beam emitted from a charged particle source, the system including: a first diaphragm group having first and second diaphragms which are diaphragms that act on the charged particle beam and have different thicknesses; and a first diaphragm switching mechanism for switching the diaphragm in the first diaphragm group, in which the computer system controls the first diaphragm switching mechanism so as to switch from the first diaphragm to the second diaphragm according to an increase or decrease of the acceleration voltage.

10 Claims, 20 Drawing Sheets

(58) Field of Classification Search
USPC ..... 250/306, 307, 309, 310, 311, 396 R, 397
See application file for complete search history.

(56) References Cited

U.S. PATENT DOCUMENTS

2014/0197336 A1  7/2014  Watanabe et al.
2015/0348738 A1  12/2015  Zeidler et al.

FOREIGN PATENT DOCUMENTS

| | | |
|---|---|---|
| JP | 6-236743 A | 8/1994 |
| JP | 7-302564 A | 11/1995 |
| JP | 2000-271237 A | 10/2000 |
| JP | 2005-44560 A | 2/2005 |
| JP | 2011-243540 A | 12/2011 |
| JP | 2013-45525 A | 3/2013 |

OTHER PUBLICATIONS

Japanese-language Written Opinion (PCT/ISA/237) issued in PCT Application No. PCT/JP2019/026230 dated Sep. 24, 2019 (three (3) pages).

* cited by examiner

[FIG. 1]
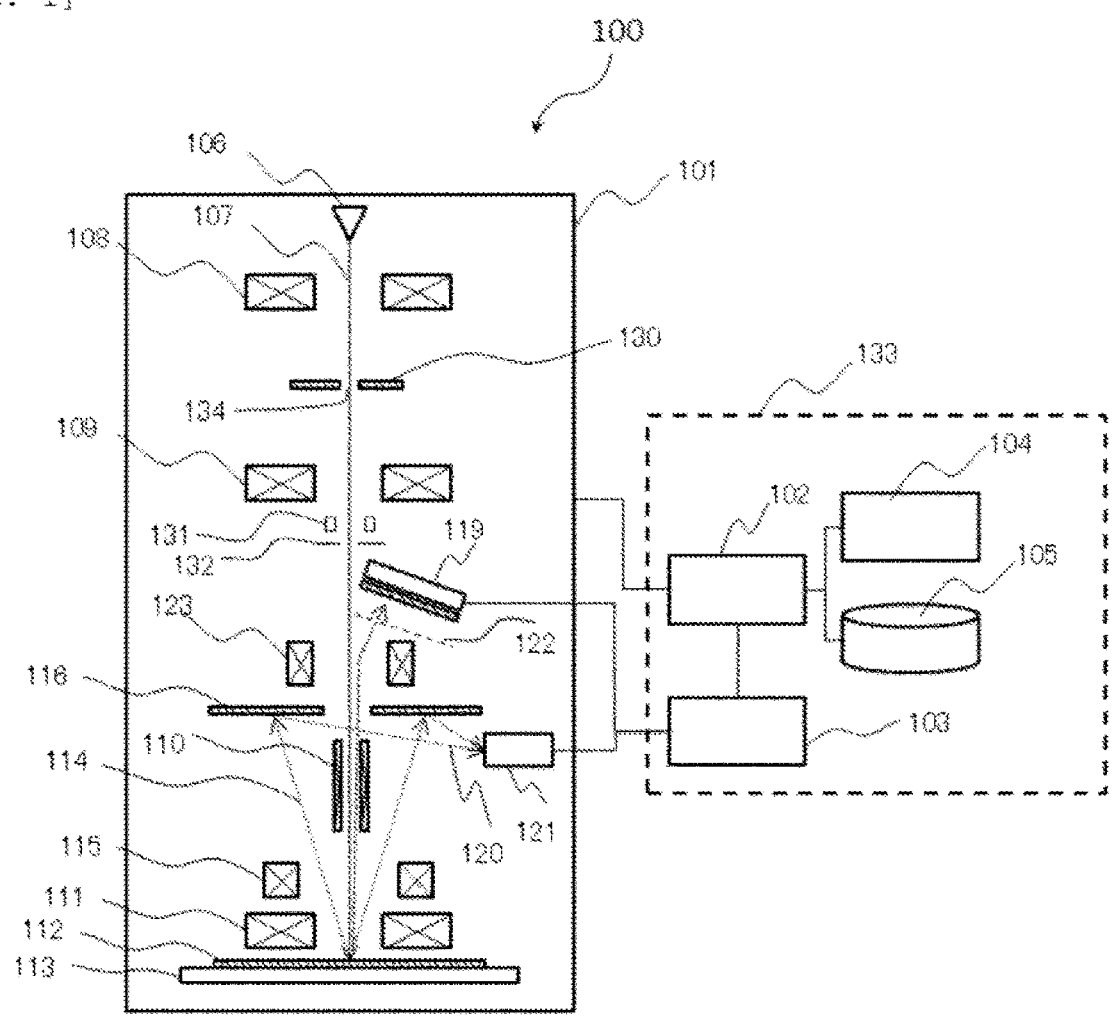

[FIG. 2]
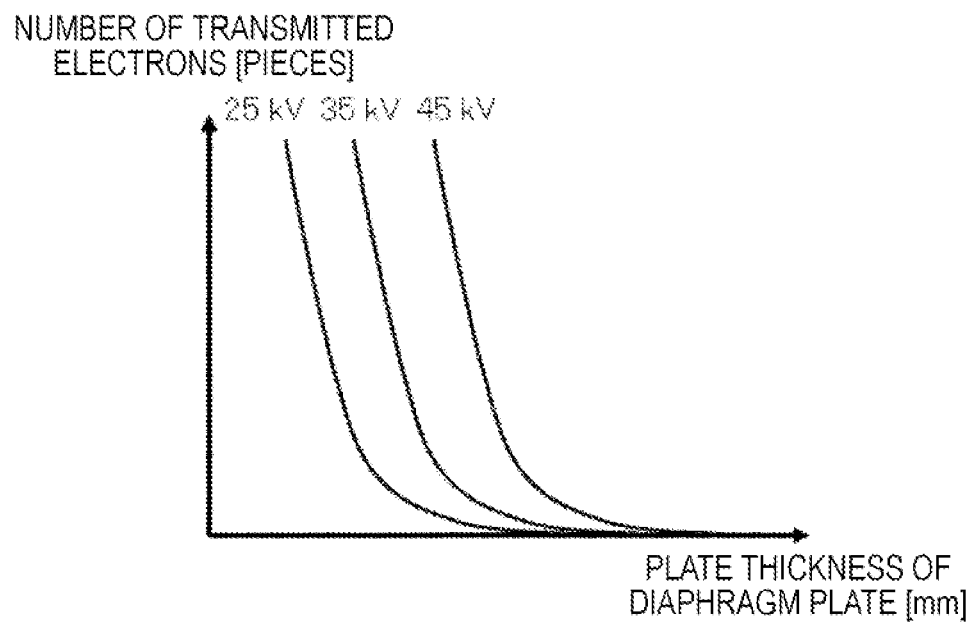
[FIG. 3]
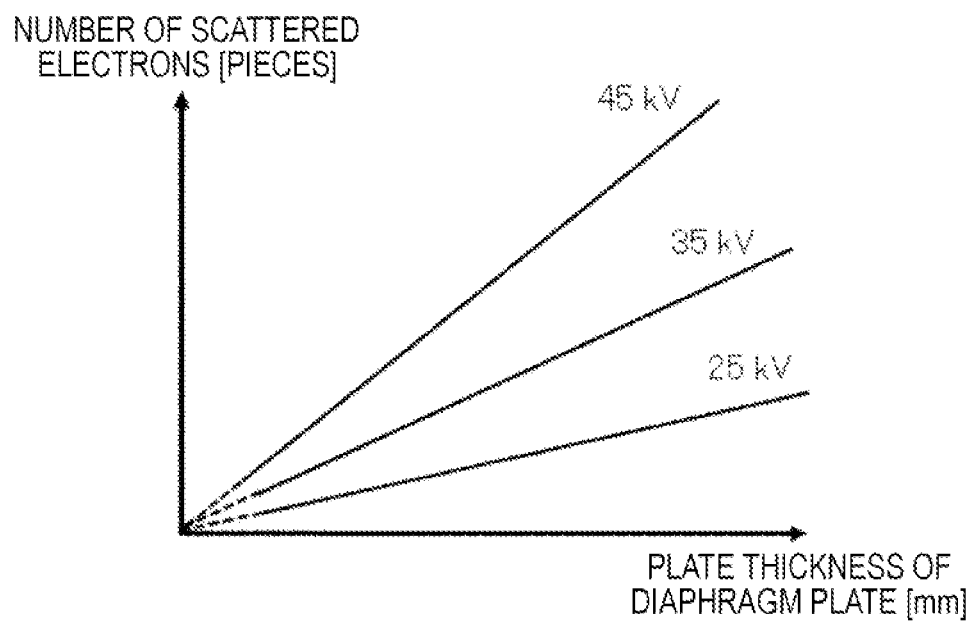

[FIG. 4]
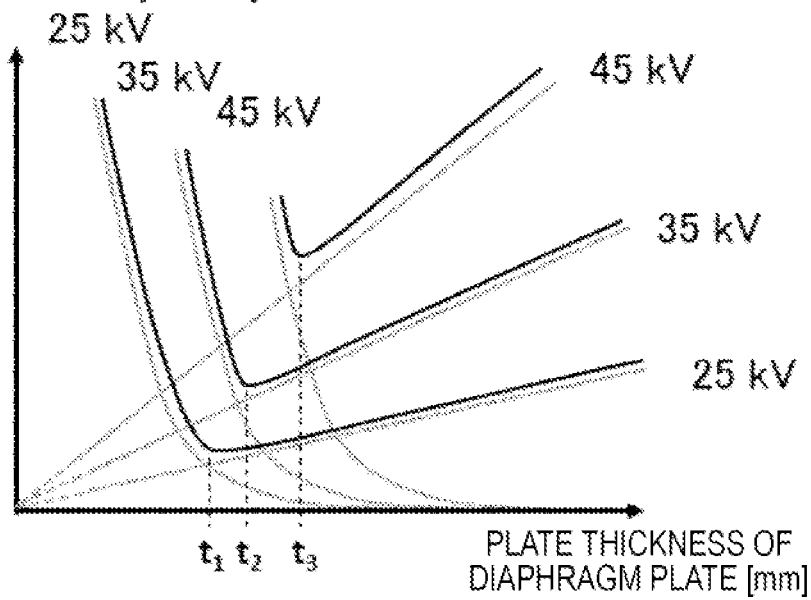

[FIG. 5]
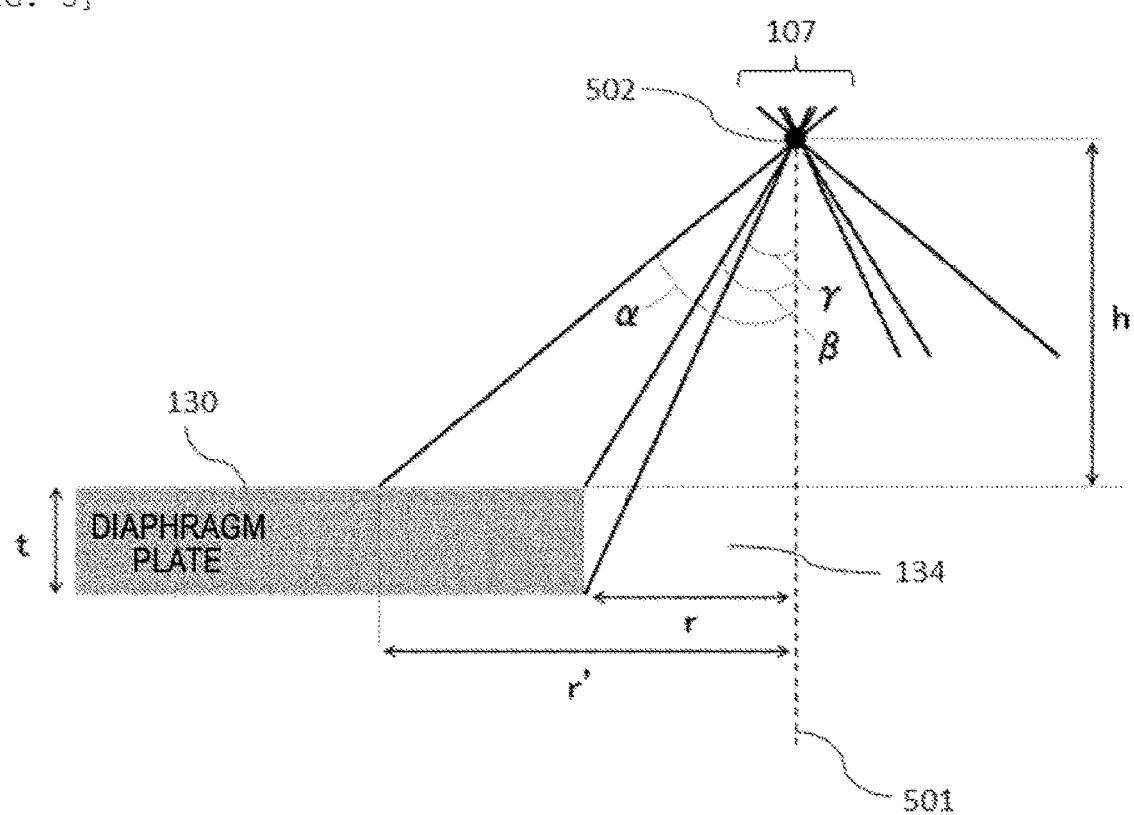

[FIG. 6]
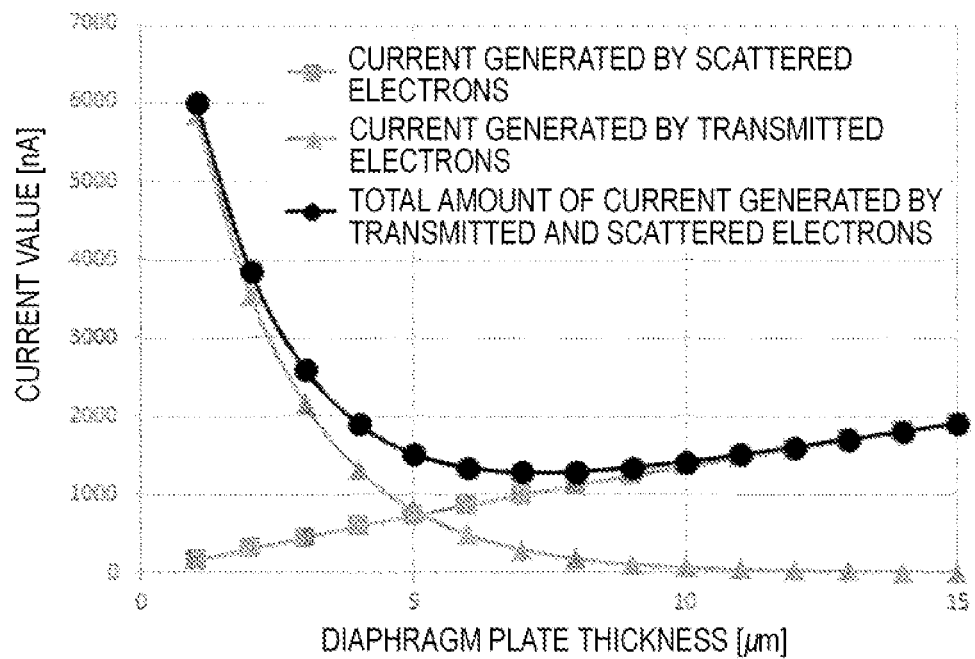
[FIG. 7]
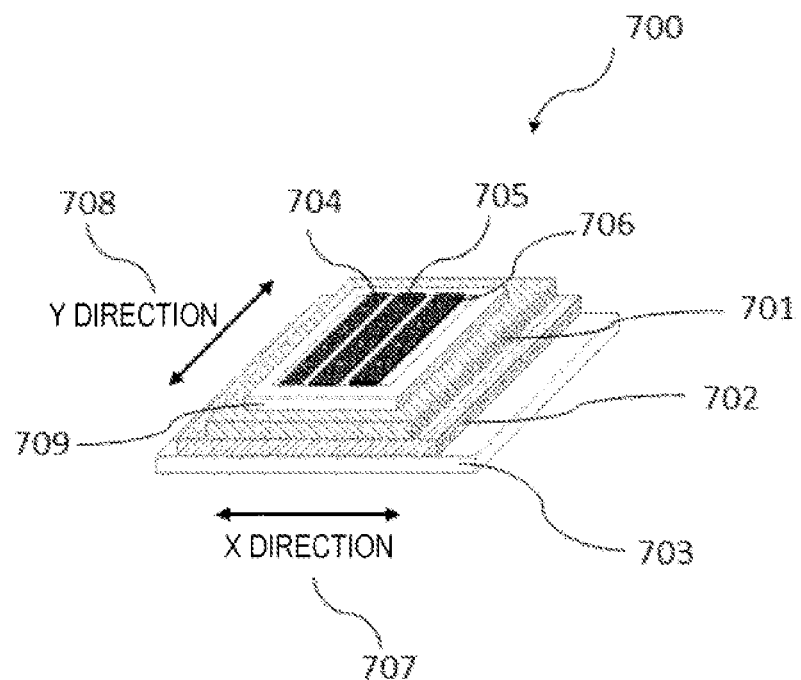

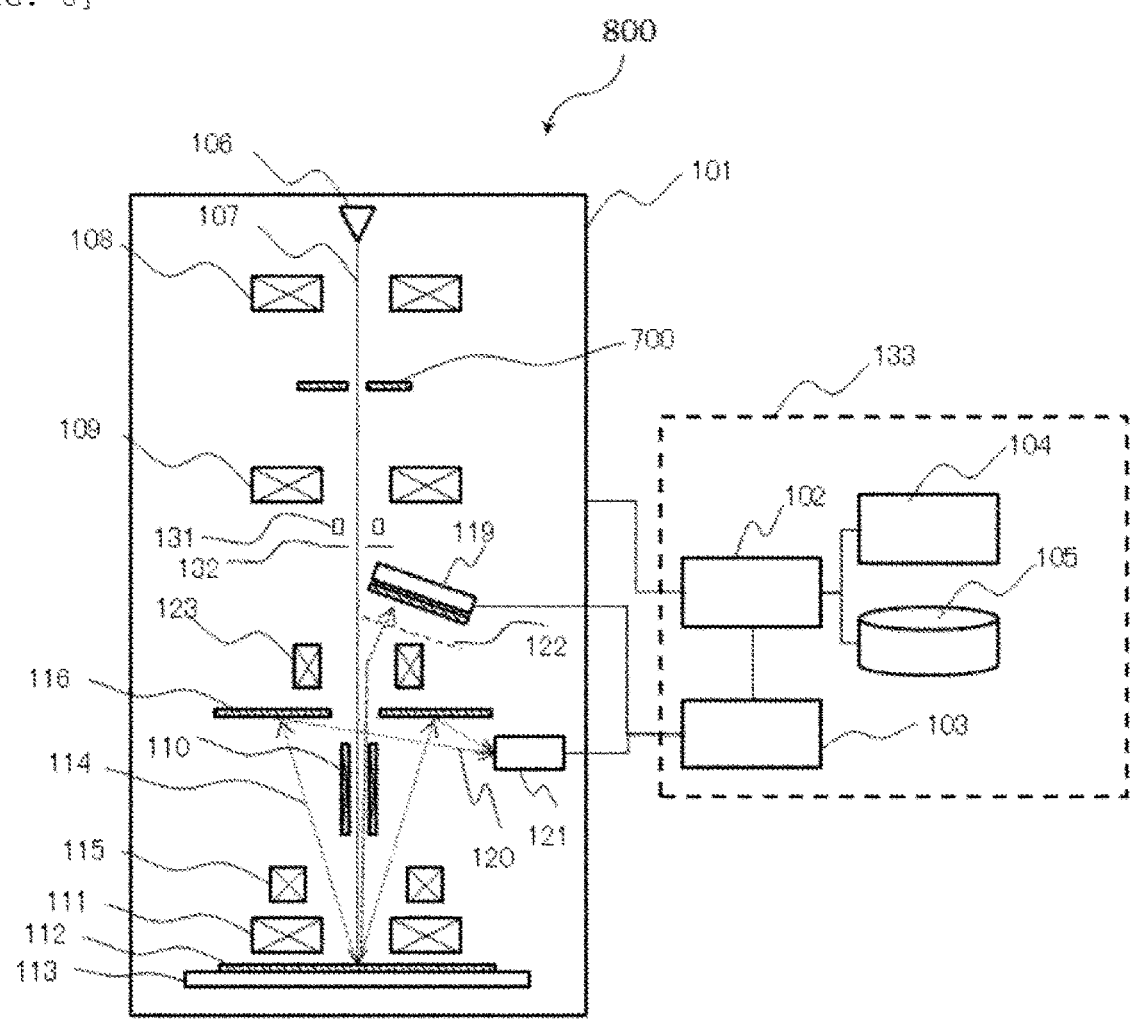
[FIG. 8]

[FIG. 9]
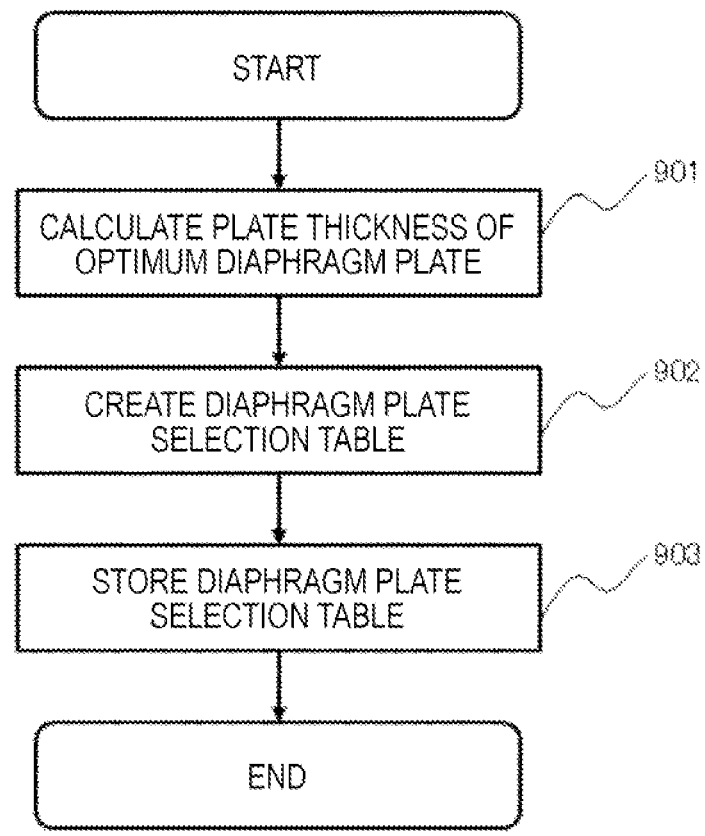

[FIG. 10]
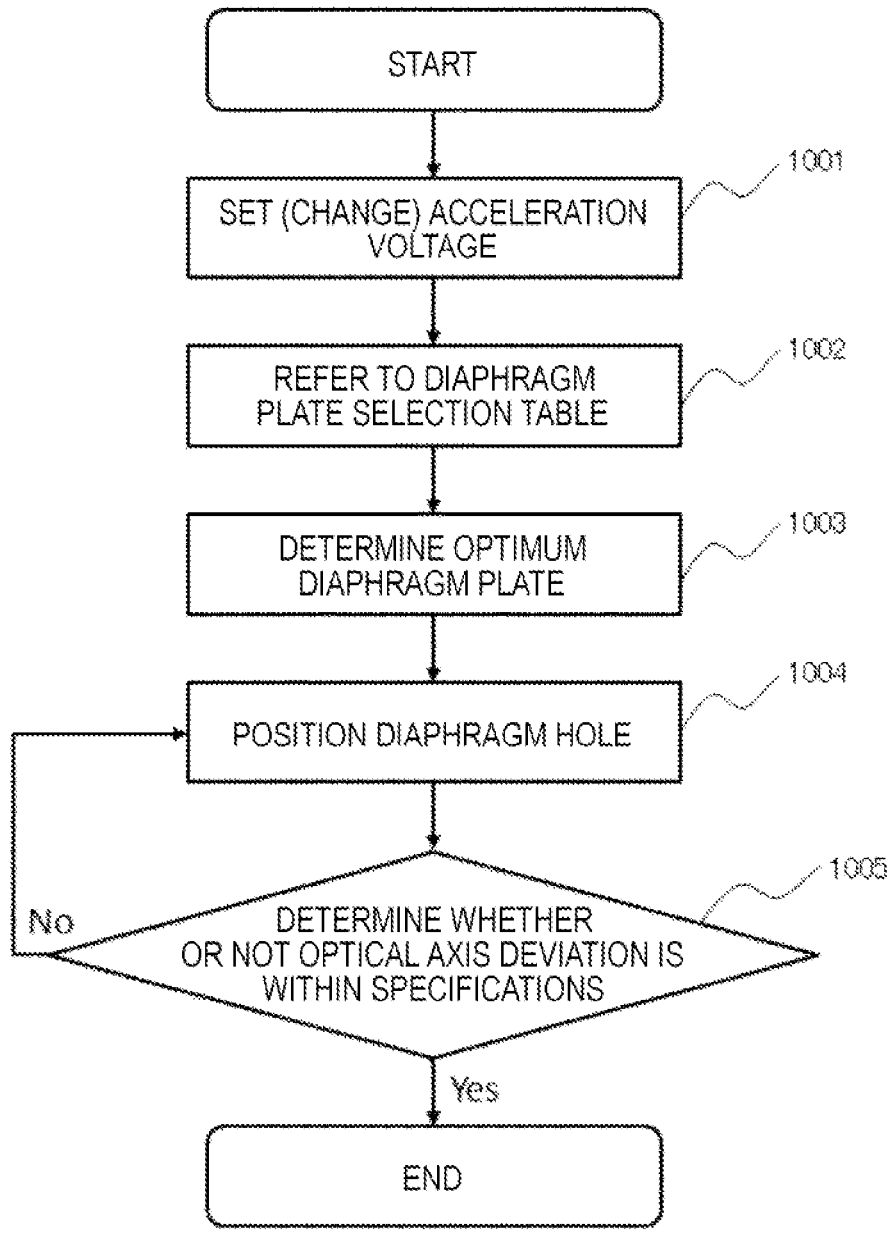

[FIG. 11]
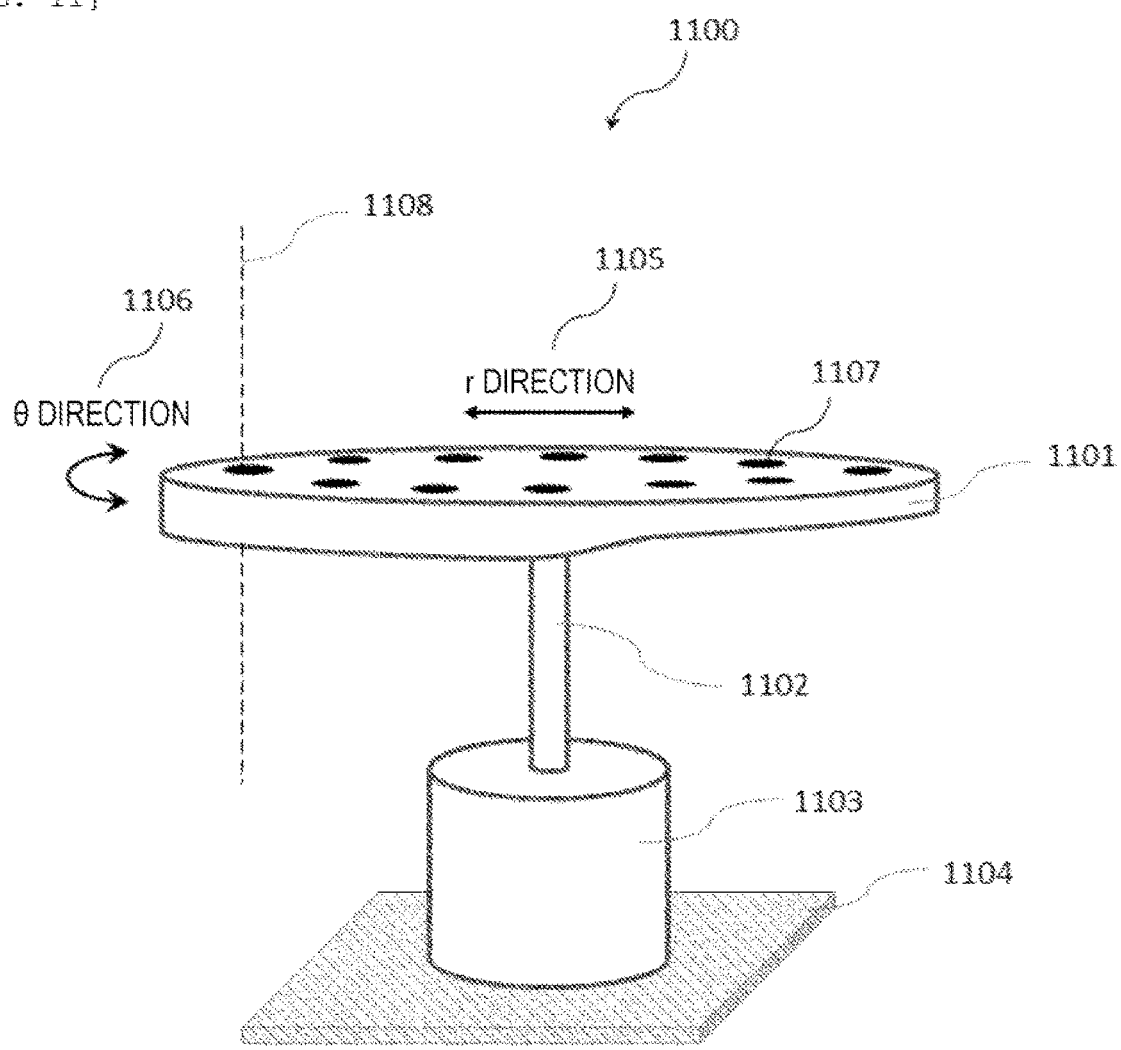

[FIG. 13]
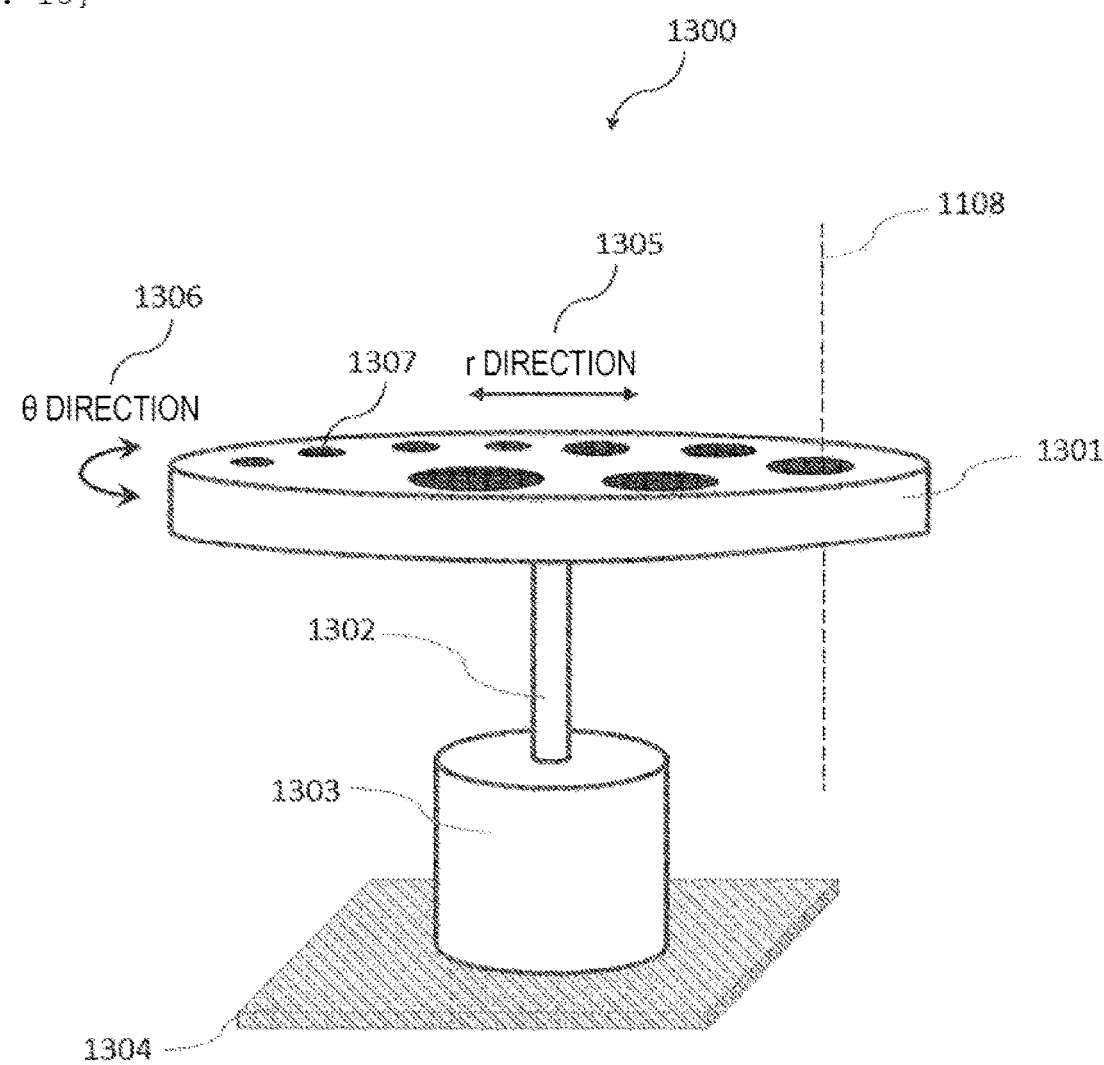

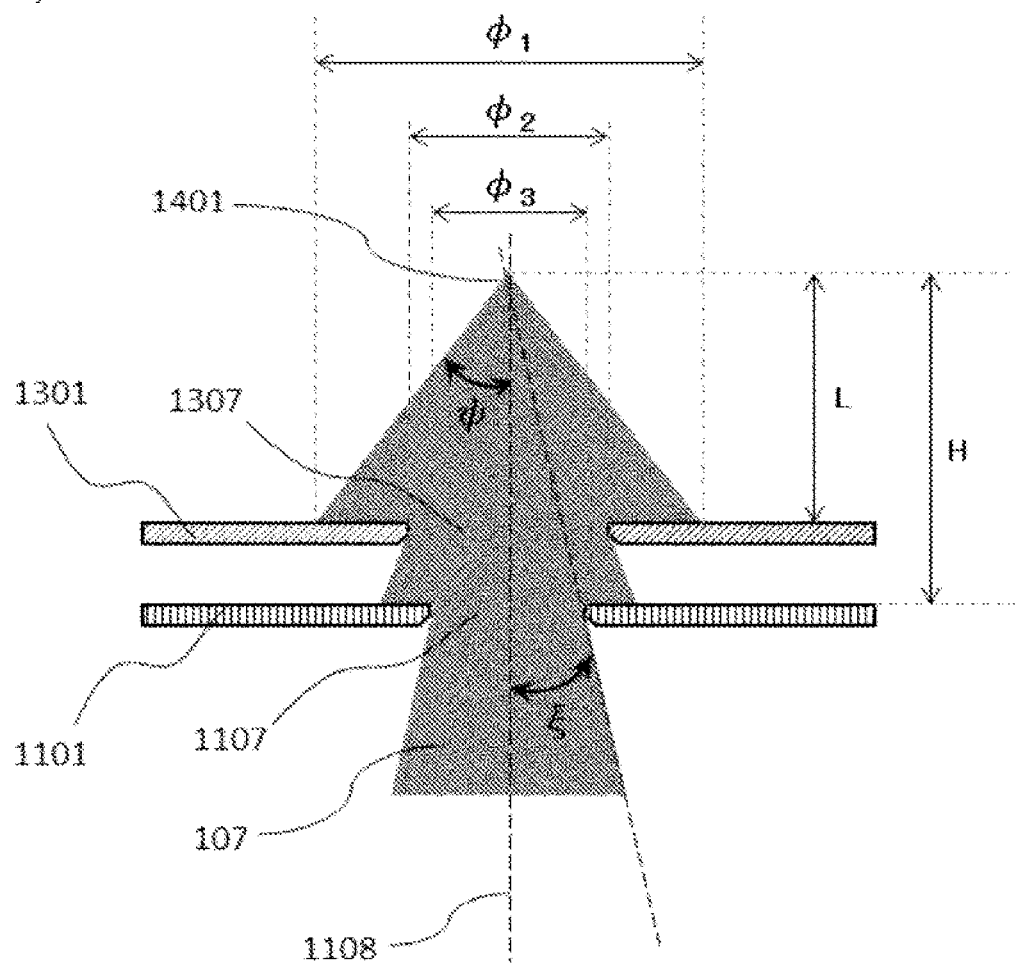
[FIG. 14]

[FIG. 15]
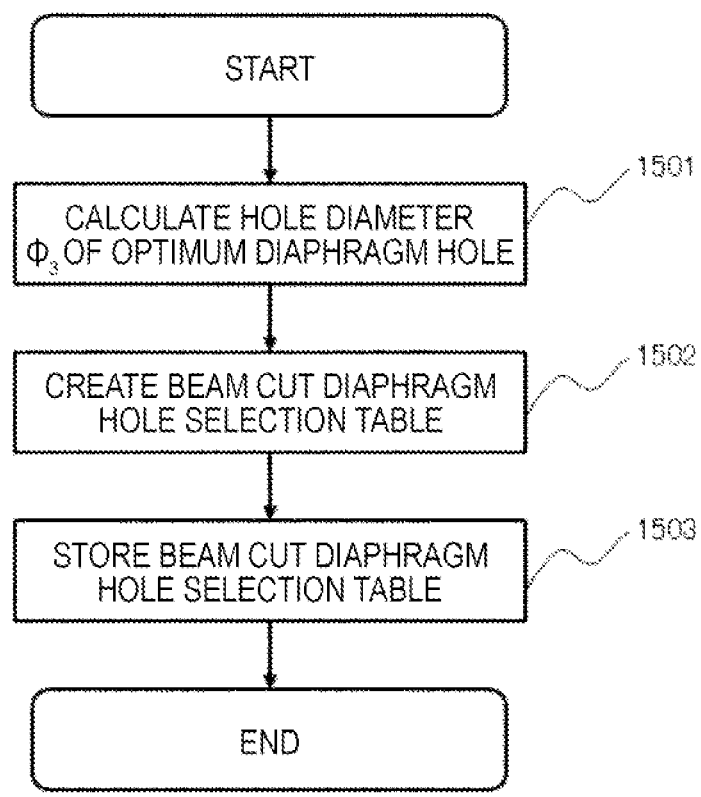

[FIG. 16]
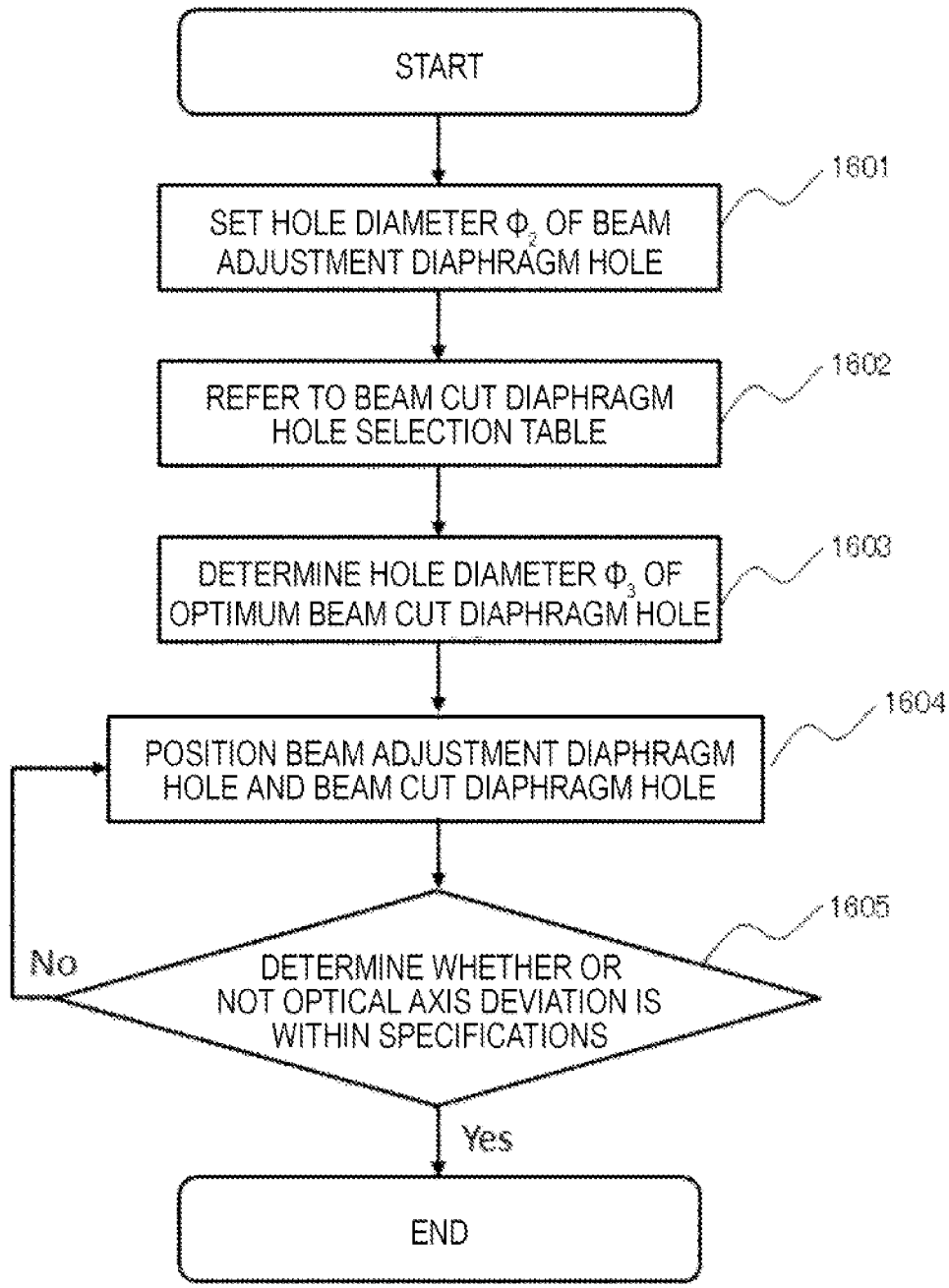

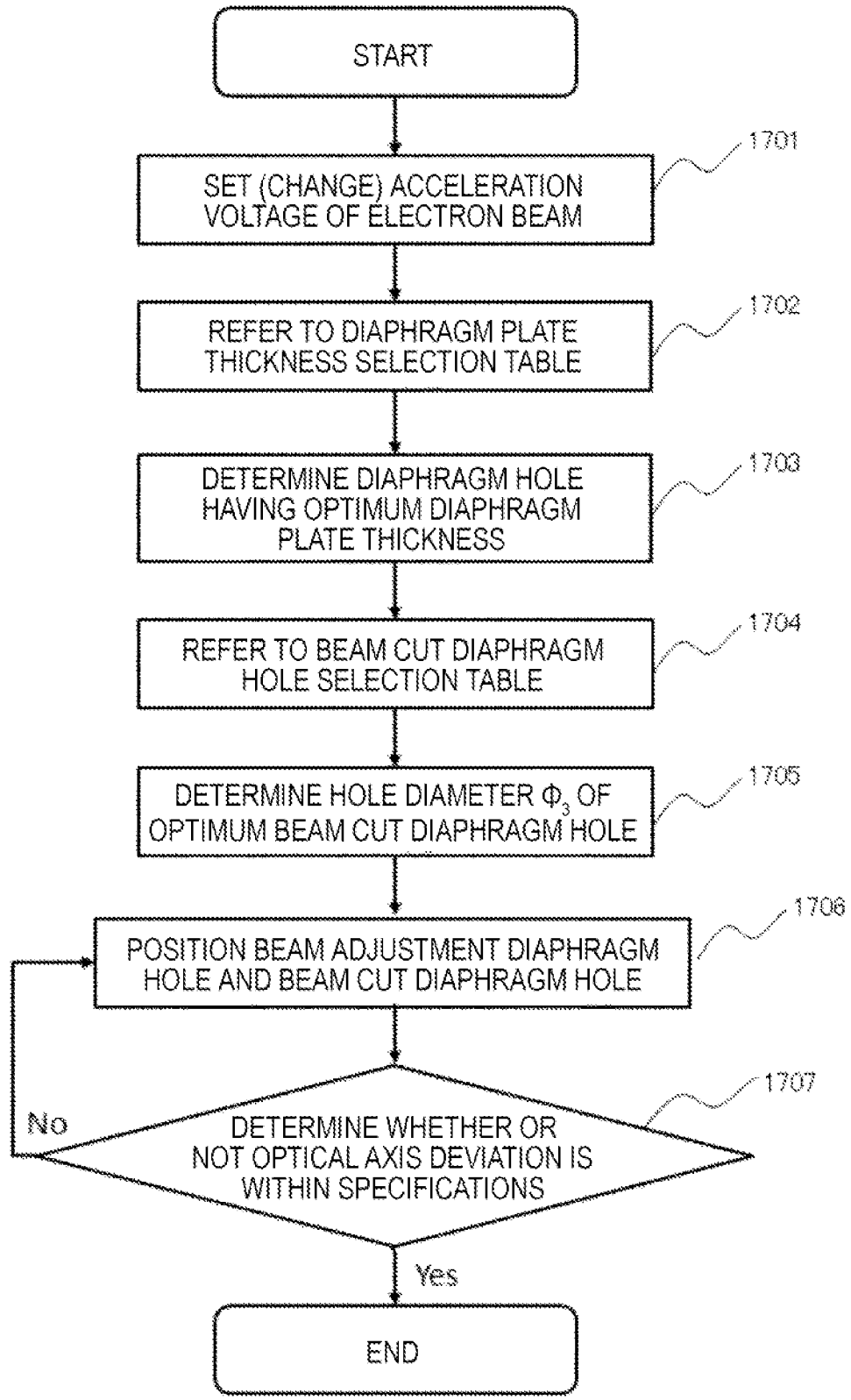
[FIG. 17]

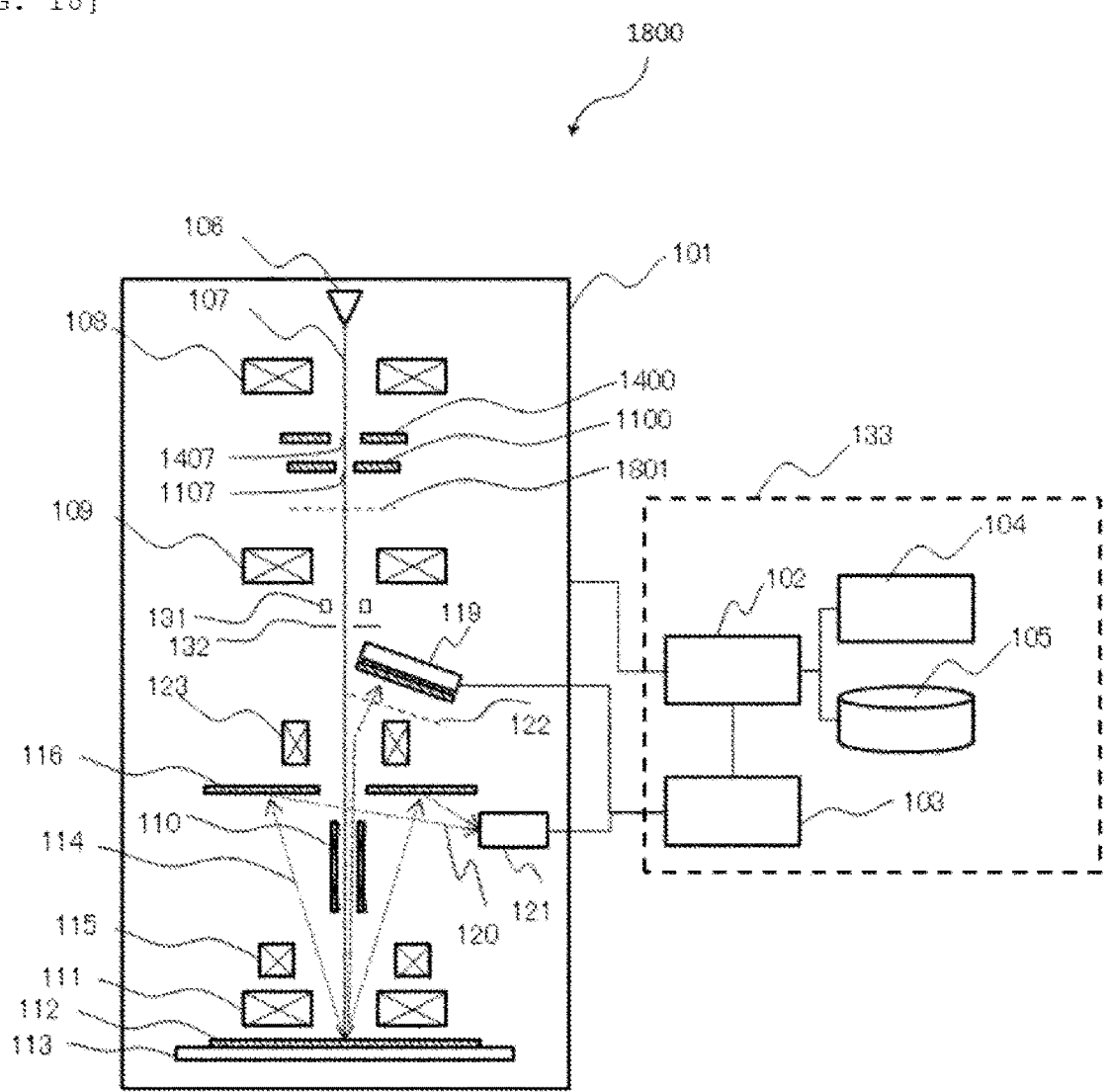
[FIG. 18]

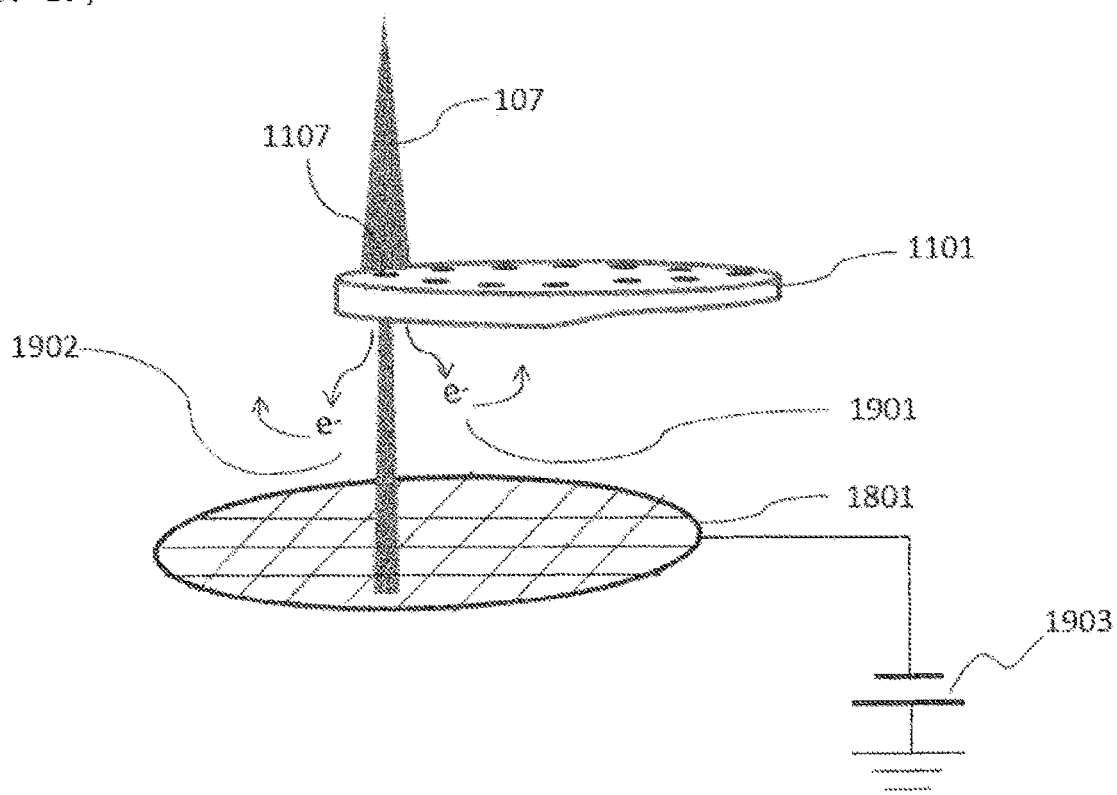
[FIG. 19]

[FIG. 20]
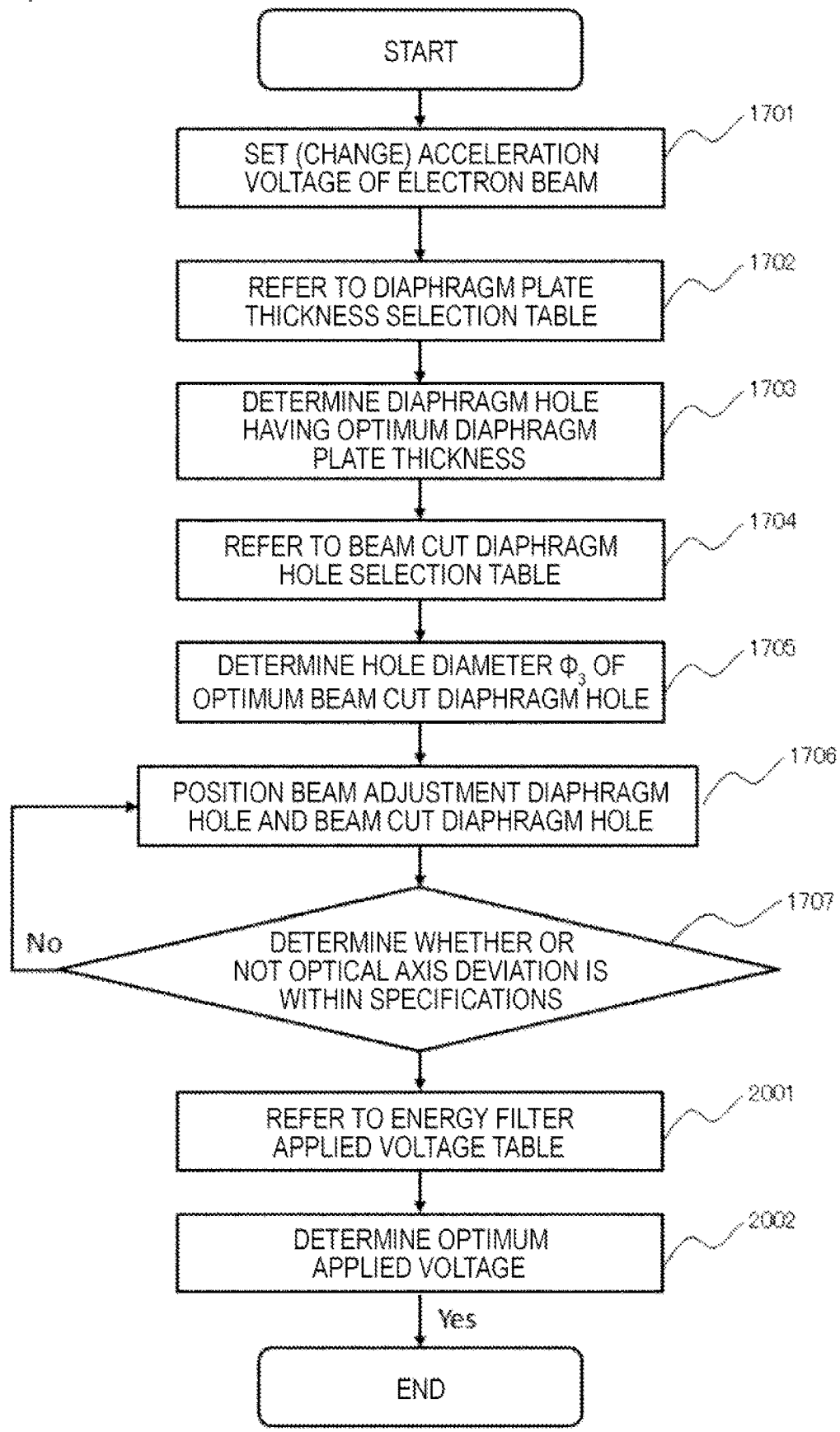

[FIG. 21]
| ACCELERATION VOLTAGE $V_A$ [kV] | 25 | 35 | 45 |
|---|---|---|---|
| PLATE THICKNESS | $t_1$ | $t_2$ | $t_3$ |
[FIG. 22]
| ACCELERATION VOLTAGE $V_A$ [kV] | $V_A < 30$ | $30 \leq V_A < 40$ | $V_A \geq 40$ |
|---|---|---|---|
| PLATE THICKNESS | $t_1$ | $t_2$ | $t_3$ |

[FIG. 23]

| HOLE DIAMETER $\phi_2$ OF BEAM ADJUSTMENT DIAPHRAGM HOLE | A | B | C |
|---|---|---|---|
| HOLE DIAMETER $\phi_3$ OF BEAM CUT DIAPHRAGM HOLE | X | Y | X |

[FIG. 24]

| ACCELERATION VOLTAGE $V_A$ [kV] | 25 | 35 | 45 |
|---|---|---|---|
| ENERGY FILTER APPLIED VOLTAGE $V_E$ | $V_1$ | $V_2$ | $V_3$ |

CHARGED PARTICLE BEAM SYSTEM

TECHNICAL FIELD

The present disclosure relates to a charged particle beam system, and more particularly to a high resolution scanning electron microscope (SEM) for measuring, inspecting, observing, and analyzing a semiconductor device.

BACKGROUND ART

In the SEM, a diaphragm plate having a diaphragm hole is disposed on a path of an electron beam emitted from an electron source generally for the purpose of adjusting an amount of electron beam, restricting passage, suppressing aberration, or molding a beam shape (hereinafter, an optical element that exerts such a desired effect on an electron beam is referred to as a "diaphragm"). At this time, when an acceleration voltage of the electron beam irradiated on the diaphragm plate is high, there is a case where the electron beam passes through the diaphragm plate (JP-A-2011-243540 (PTL 1)). Further, a phenomenon is known in which the electron beam irradiated to the diaphragm plate is scattered at an edge of the diaphragm hole (JP-A-6-5499 (PTL 2)). These transmitted electrons (beam) or scattered electrons (beam) have different energies and angular distributions from the electron beam (hereinafter, also referred to as "main beam") that have passed through the diaphragm hole, and thus, a phenomenon is generated in which the electrons converge on a sample in a trajectory different from an electron trajectory of the main beam (hereinafter, the phenomenon is also referred to as "flare"). This flare causes deterioration of the resolution of the SEM image.

CITATION LIST

Patent Literature

PTL 1: JP-A-2011-243540
PTL 2: JP-A-6-5499
PTL 3: JP-A-6-163371

SUMMARY OF INVENTION

Technical Problem

The transmitted electrons and scattered electrons generated by irradiating the diaphragm plate and the vicinity of the diaphragm hole with the electron beam show different aspects depending on the acceleration voltage of the electron beam. In other words, since the state of the generated flare differs depending on the acceleration voltage of the electron beam used, an appropriate method capable of minimizing the influence of the flare is required for each acceleration voltage. However, in the technologies of the related art including PTL 1 to PTL 3, there is no disclosure of a solution that can appropriately solve the problem that flares having different states are generated for each acceleration voltage.

Solution to Problem

According to an aspect of the means for solving the above problems, hereinafter, there is provided a charged particle beam system having a computer system for controlling an acceleration voltage of a charged particle beam emitted from a charged particle source, the system including: a first diaphragm group having first and second diaphragms which are diaphragms that act on the charged particle beam and have different thicknesses; and a first diaphragm switching mechanism for switching the diaphragm in the first diaphragm group, in which the computer system controls the first diaphragm switching mechanism so as to switch from the first diaphragm to the second diaphragm according to an increase or decrease of the acceleration voltage.

Advantageous Effects of Invention

According to the above-described method or configuration, the influence of flare of which the state differs depending on the acceleration voltage of the electron beam can be minimized, and thus, the resolution deterioration of an SEM image due to flare can be suppressed.

BRIEF DESCRIPTION OF DRAWINGS

FIG. 1 is a schematic configuration view of an SEM type length measurement system (charged particle beam system) according to Example 1.

FIG. 2 is a relationship diagram of the number of electrons passing through a diaphragm plate, an acceleration voltage of an electron beam, and a plate thickness of the diaphragm plate.

FIG. 3 is a relationship diagram of the number of electrons scattered at a side wall portion of a diaphragm hole, the acceleration voltage of the electron beam, and the plate thickness of the diaphragm plate.

FIG. 4 is a relationship diagram of the acceleration voltage, the plate thickness of the diaphragm plate, and the total number of transmitted electrons and scattered electrons.

FIG. 5 is a schematic diagram of the electron beam irradiated to a beam adjustment diaphragm plate.

FIG. 6 is a diagram illustrating calculation results of a current amount generated by the transmitted electrons with respect to the plate thickness of the diaphragm plate, a current amount generated by the scattered electrons, and the total amount of the transmitted electrons and scattered electrons.

FIG. 7 is a view illustrating an embodiment of a beam adjustment diaphragm plate unit.

FIG. 8 is a schematic configuration view of another SEM type length measurement system (charged particle beam system) according to Example 1.

FIG. 9 is a flow chart for creating a diaphragm plate selection table.

FIG. 10 is a flow chart for determining the beam adjustment diaphragm plate having an optimum plate thickness and executing positioning adjustment of the diaphragm hole.

FIG. 11 is a view illustrating another embodiment of the beam adjustment diaphragm plate unit.

FIG. 13 is a view illustrating an embodiment of a beam cut diaphragm unit.

FIG. 14 is a view illustrating a relationship of the beam adjustment diaphragm plate, a beam cut diaphragm plate, and the electron beam.

FIG. 15 is a flow chart for creating a beam cut diaphragm hole selection table.

FIG. 16 is a flow chart for determining a hole diameter of an optimum beam cut diaphragm hole and executing the positioning adjustment of the diaphragm hole.

FIG. 17 is a flow chart when the diaphragm plate selection table and the beam cut diaphragm hole selection table are used.

FIG. 18 is a schematic configuration view of an SEM type length measurement system (charged particle beam system) according to Example 3.

FIG. 19 is a detailed view of the periphery of a beam adjustment diaphragm plate and an energy filter.

FIG. 20 is a flow chart when a diaphragm plate selection table, a beam cut diaphragm hole selection table, and an energy filter applied voltage table are used.

FIG. 21 is a diagram illustrating an example of the diaphragm plate selection table.

FIG. 22 is a diagram illustrating another example of the diaphragm plate selection table.

FIG. 23 is a diagram illustrating an example of the beam cut diaphragm hole selection table.

FIG. 24 is a diagram illustrating an example of the energy filter applied voltage table.

DESCRIPTION OF EMBODIMENTS

Figure 12:
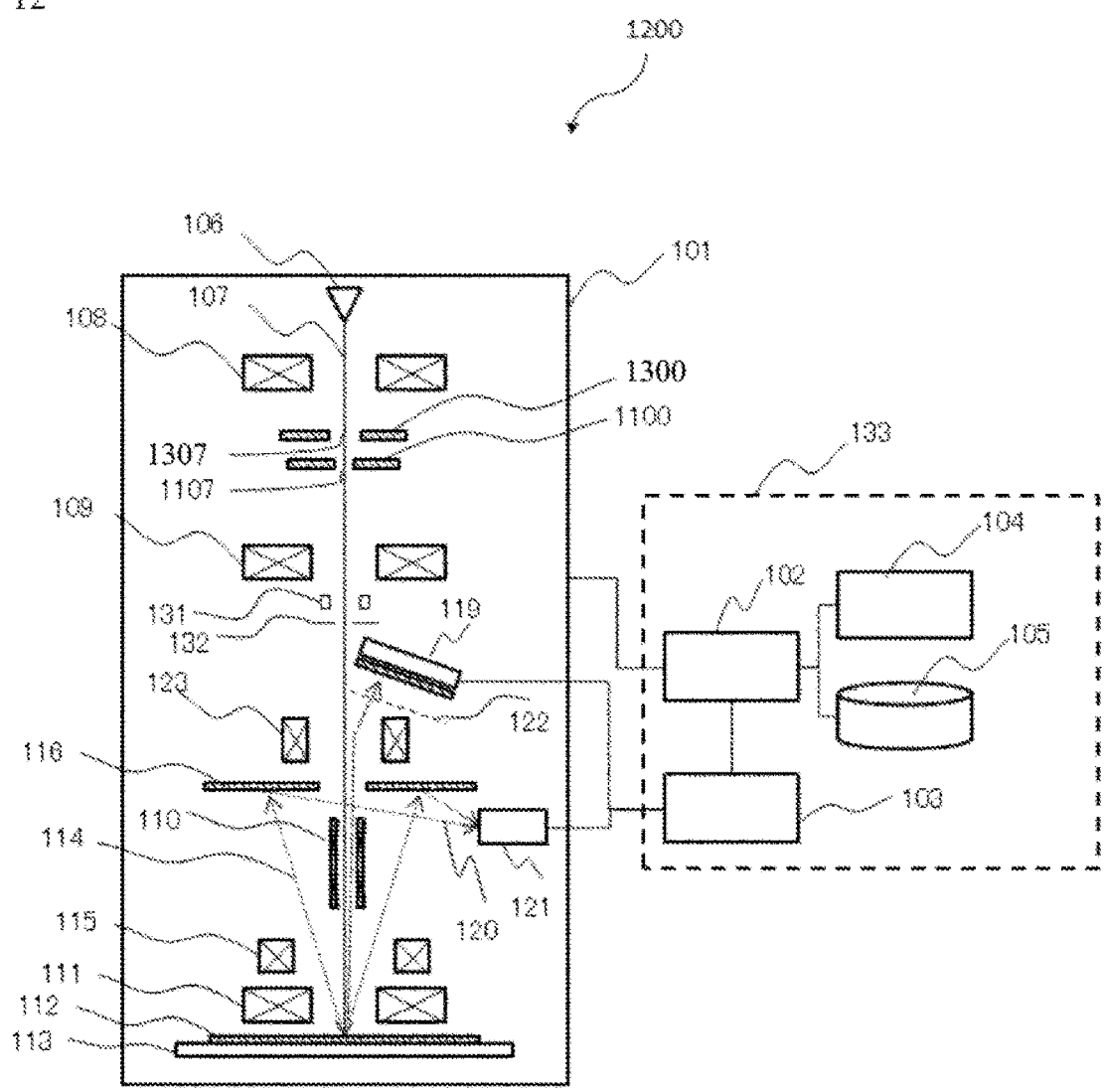
FIG. 12 is a schematic configuration view of an SEM type length measurement system (charged particle beam system) according to Example 2.

Hereinafter, embodiments will be described in detail with reference to the attached drawings. In the attached drawings, there is a case where functionally identical elements are represented by the same number or corresponding number. Further, in the drawings used in the following embodiments, there is also a case where hatching is also added to make the drawings easier to understand in plan views. The attached drawings illustrate embodiments and implementation examples in accordance with the principles of the present disclosure, but these are for the purpose of understanding the present disclosure and are never used to interpret the present disclosure in a limited manner. The description of the present specification is merely a typical example, and does not limit the scope of claims or application examples of the present disclosure in any sense.

In the present embodiment, the description is given sufficiently in detail for those skilled in the art to implement the present disclosure, but it is necessary to understand that other implementations and embodiments are also possible and it is possible to change the configuration and structure and replace various elements without departing from the scope and spirit of the technical idea of the present disclosure. Therefore, the following description should not be interpreted while being limited thereto.

In the embodiment described below, as an example of a charged particle beam system, an SEM type length measurement system (also referred to as a length measuring SEM) that measures a pattern on a semiconductor wafer using an electron beam will be described as an example, but "Scanning Electron Microscope (SEM)" broadly includes a device for capturing an image of a sample using an electron beam. Other examples of the charged particle beam system include a scanning ion microscope for observing a sample, and a focused ion beam system for processing a sample. Further, other examples of the scanning electron microscope include an inspection device using a scanning electron microscope, a review device, a general-purpose scanning electron microscope, a sample processing device including a scanning electron microscope, and a sample analysis device, and the present disclosure is also applicable to these devices. In addition, in the examples described below, examples of the scanning electron microscope include a system in which the scanning electron microscope is connected by a network and a combined device in which a plurality of sets of scanning electron microscopes are combined.

Further, in the embodiment described below, the "sample" will be described as an example of a semiconductor wafer on which a pattern is formed, but the present disclosure is not limited thereto, and a metal, ceramics, a biological sample, or the like may be used.

In recent years, semiconductor devices have become finer and three-dimensional in structure. For example, in the integrated circuit technology of a logic IC, due to advances in EUV exposure technology, miniaturization with a line width of 10 nm or less is progressing, and especially for the SEM for measuring the dimensions of fine patterns formed on wafers of semiconductors or the like, higher length measurement accuracy and reduction of machine difference between devices are required. Meanwhile, memory devices such as DRAM or NAND are becoming more three-dimensional in structure, and there is an increasing need for measurement of deep hole and deep groove patterns and the like. As represented by this length measuring SEM, in recent years, in the SEM that measures, inspects, observes, and analyzes a semiconductor device, the acceleration voltage of the electron beam is changed within a wide range of several hundreds of V to several tens of kV in order to meet various needs, and the performance that can obtain a high-resolution SEM image is required. At the same time, there is a demand for an SEM in which there is little change in device performance over time and machine differences between devices.

Hereinafter, in particular, a scanning electron microscope capable of stably acquiring a high-resolution SEM image over a long period of time and having a small performance difference will be described in detail with reference to the drawings.

EXAMPLE 1

FIG. 1 illustrates a schematic configuration of an SEM type length measurement system (charged particle beam system) according to Example 1.

An SEM type length measurement system 100 includes a beam irradiation system (also referred to as a capturing tool) 101 and a computer system 133. The computer system 133 includes an overall control unit 102, a signal processing unit 103, an input/output unit 104, and a storage unit 105.

The electrons emitted from an electron gun 106 in the beam irradiation system 101 are accelerated by an acceleration electrode (not illustrated) and are irradiated to a sample 112 (for example, a wafer on which a pattern is formed) as a primary electron beam 107 (also referred to as an electron beam). The beam irradiation system 101 includes a first focusing lens 108 that focuses the electron beam 107, and a second focusing lens 109 that further focuses the electron beam that has passed through the focusing lens 108. The beam irradiation system 101 further includes a deflector 110 that deflects the electron beam 107, and an objective lens 111 that controls the focusing point (focal point) of the electron beam 107. The electron beam 107 that has passed through each optical element provided in the beam irradiation system 101 irradiates the sample 112 mounted on the stage 113. Emitted electrons 114 such as secondary electrons (SE) and backscattered electrons (BSE), which are emitted from the sample by irradiation of the electron beam 107, are guided in a predetermined direction by the deflector 115 (first secondary electron aligner) for deflecting the emitted electrons. The deflector 115 is a so-called Wien filter, and selectively deflects the emitted electrons 114 in a predetermined direction without deflecting the electron beam. Further, the acceleration voltage of the electron beam 107 can be switched and used within a wide range according to the target sample 112.

The detection diaphragm 116 is capable of angularly discriminating the emitted electrons 114. The emitted electrons 114 that have passed through the detection diaphragm 116 are guided by the deflector 123 (second secondary electron aligner) to a detector 119 disposed off-axis. The detector 119 has a detection surface at a position where the emitted electrons 114 collide, and for example, the emitted electrons incident on the detection surface are converted into an optical signal by a scintillator provided on the detection surface. This optical signal is amplified by a photomultiplier and converted into an electric signal, which becomes the output of the detector. Further, an energy filter 122 provided immediately before the detector 119 can discriminate the emitted electrons 114 having a passing trajectory in the vicinity of an optical axis. Meanwhile, the detector 121 detects tertiary electrons 120 (secondary electrons of the emitted electrons 114) generated by the emitted electrons 114 colliding with the wall surface of the detection diaphragm 116.

Further, in the scanning electron microscope exemplified in FIG. 1, a beam adjustment diaphragm plate 130, which has a function of partially restricting the passage of the electron beam and forming the electron beam, and a blanking deflector 131 for restricting the arrival of the electron beam at the sample 112 by reflecting the electron beam 107 off the optical axis. The beam adjustment diaphragm plate 130 is provided with a diaphragm hole 134 through which the electron beam 107 passes. A Faraday cup 132 blocks the electron beam 107 deflected by the blanking deflector 131, measures the current flowing into the Faraday cup 132, and accordingly can obtain the number of electrons incident on the Faraday cup 132 per unit time. From the signal output of the Faraday cup 132, it is possible to monitor the probe current of the electron beam 107 that irradiates the sample.

The optical element provided in the scanning electron microscope as described above is controlled by the overall control unit 102.

The signal processing unit 103 generates an SEM image based on the outputs of the detectors 119 and 121. The signal processing unit 103 generates image data by storing a detection signal in a frame memory or the like in synchronization with scanning by a scanning deflector (not illustrated). When storing the detection signal in the frame memory, the signal profile (one-dimensional information) and the SEM image (two-dimensional information) are generated by storing the detection signal at a position corresponding to the scanning position of the frame memory.

Next, the beam adjustment diaphragm plate 130 used in the present example will be described.

In general, the beam adjustment diaphragm plate is made of a metal material having a large number of atoms in order to block the electron beam irradiated to the diaphragm plate part other than the diaphragm hole. Otherwise, in order to make the shape of the diaphragm holes uniform, there is a case where a diaphragm plate formed by a semiconductor process using silicon (Si) as a base material and coated with a heavy metal coating film is used as a beam adjustment diaphragm plate. However, in the technology using such a beam adjustment diaphragm plate of the related art, when the acceleration voltage of the electron beam is changed within a wide range of several hundreds of V to several tens of kV to acquire a high-resolution SEM image, the following problem occurs with the switching of the acceleration voltage.

When the energy of the electron beam irradiated to the adjustment diaphragm plate used for beam adjustment is high (when the acceleration voltage of the electron beam is high), electrons that pass through the base material part (the diaphragm plate part other than the diaphragm hole) of the diaphragm plate are generated. The electrons that have passed through the base material part of the diaphragm plate have lower energy than that of the electrons that pass through the diaphragm holes, and are emitted from the lower surface of the adjustment diaphragm plate in random directions. FIG. 2 is a graph illustrating a relationship of the number of electrons passing through the diaphragm plate, the acceleration voltage of the electron beam, and the plate thickness of the diaphragm plate when the base material of the diaphragm plate is made of the same metal material. The number of electrons transmitted through the base material part of the diaphragm plate increases as the plate thickness of the diaphragm plate becomes thinner, and increases as the acceleration voltage of the electron beam increases.

Meanwhile, in addition to the electrons passing through the base material part of the diaphragm plate, there are also electrons scattered at the side wall portion (inner wall portion) of the diaphragm hole. The term "scattering" here refers to electrons of which the traveling direction is changed at the side wall portion of the diaphragm hole, or electrons that are reflected at the side wall portion of the diaphragm hole and travel toward the optical axis (or toward the central axis of the diaphragm hole) of the beam irradiation system. The electrons scattered at the side wall portion of the diaphragm hole have lower energy than that of the electrons passing through the diaphragm hole, and fly from the side wall portion of the diaphragm hole in random directions. FIG. 3 is a graph illustrating a relationship of the number of electrons scattered at the side wall portion of the diaphragm hole, the acceleration voltage of the electron beam, and the plate thickness of the diaphragm plate when the base material of the diaphragm plate is made of the same metal material. The number of electrons scattered at the side wall portion of the diaphragm hole increases as the plate thickness of the diaphragm plate increases, that is, as the height of the side wall portion of the diaphragm hole increases, and increases as the acceleration voltage of the electron beam increases.

The electrons transmitted through the base material part of the diaphragm plate or the electrons scattered at the side wall portion of the diaphragm hole cause the above-described flare and cause deterioration of the resolution of the SEM image. Further, when the electrons transmitted through the base material part of the diaphragm plate reach the Faraday cup, there is a concern that erroneous detection of the probe current value of the electron beam is caused.

The above-described problems can be solved by the aspect of examples illustrated in the present disclosure.

As described above, the inventors have analyzed in detail the relationship of the number of transmitted electrons, the number of scattered electrons, the acceleration voltage of the electron beam, and the plate thickness of the diaphragm plate, and as a result, as illustrated in FIG. 4, the inventors newly found that there are plate thicknesses (for example, $t_1$, $t_2$, $t_3$ or the like in FIG. 4) at which the total amount of the number of electrons transmitted through the beam-adjusting diaphragm plate and the number of electrons scattered at the side wall portion of the diaphragm hole of the beam adjustment diaphragm plate (total amount of transmitted electrons and scattered electrons) is minimized. In addition, from the relationship illustrated in FIG. 4, the inventors have newly found that the plate thickness of the beam adjustment diaphragm plate increases when the acceleration voltage of the electron beam increases, and the plate thickness of the beam adjustment diaphragm plate decreases when the acceleration voltage of the electron beam decreases, and accordingly, the total amount of transmitted electrons and scattered electrons can be minimized.

Hereinafter, a specific calculation method regarding the optimum plate thickness of the beam adjustment diaphragm plate will be described.

FIG. 5 illustrates a schematic view of the electron beam 107 irradiated to the beam adjustment diaphragm plate 130. The electron beam 107 is focused by the first focusing lens 108 at a point between the first focusing lens 108 and the diaphragm plate 130 (above the diaphragm plate 130). Hereinafter, this focusing point is also referred to as a crossover. Here, it is assumed that the electron beam 107 focused on a crossover (focusing point) 502 spreads at an emission angle α and irradiates the beam adjustment diaphragm plate 130, the distance from the crossover 502 to the upper surface of the diaphragm is h, the plate thickness (thickness) of the diaphragm plate 130 is t, the radius of the diaphragm hole 134 is r, and the maximum radius of the electron beam irradiated to the upper surface of the beam adjustment diaphragm plate 130 is r'. At this time, a current amount Is of the electron beam (electron beam scattered to the side wall portion of the diaphragm hole 134) irradiated to the side wall portion of the diaphragm hole 134 of the diaphragm plate 130 can be expressed as in Equation 1 by using a radiation angle current density J and angles β and γ illustrated in FIG. 5.

$$Is = J\pi(\beta^2 - \gamma^2) \quad \text{[Equation 1]}$$

When transformed by using r, h, and t, the following Equation 2 is obtained.

$$Is = J\pi[\{\tan^{-1}(r/h)\}^2 - \{\tan^{-1}(r/(h+t))\}^2] \quad \text{[Equation 2]}$$

In addition, a current value Iu of the electron beam irradiated to the upper surface of the diaphragm plate 130 can be expressed as in Equation 3 by using the radiation angle current density J and the angles α and β illustrated in FIG. 5.

$$Iu = J\pi(\alpha^2 - \beta^2) \quad \text{[Equation 3]}$$

When transformed by using r, r', and h, the following Equation 4 is obtained.

$$Iu = J\pi[\{\tan^{-1}(r'/h)\}^2 - \{\tan^{-1}(r/h)\}^2] \quad \text{[Equation 4]}$$

Meanwhile, the electron beam irradiated to the upper surface of the diaphragm plate 130 decays exponentially with respect to the plate thickness t inside the diaphragm plate 130 and is emitted as a transmitted electron from the lower surface of the diaphragm plate 130. At this time, a current amount It of the electron beam transmitted through the diaphragm plate 130 can be expressed as in Equation 5 by using the current value Iu and a decay constant λ of the electron beam irradiated to the upper surface of the diaphragm plate 130. The decay constant λ is a parameter determined by the material of the diaphragm plate 130 and the acceleration voltage of the electron beam.

$$It = Iu \times \exp(-\lambda t) \quad \text{[Equation 5]}$$

From the relationship of the above-described Equations 1 to 5, by obtaining an intersection between the current amount Is of the electron beam scattered at the side wall portion of the diaphragm hole 134 and the current amount It of the electron beam transmitted through the diaphragm plate 130, the optimum plate thickness t can be determined. The various parameters described in Equations 1 to 5 are parameters obtained by experiments and calculations.

FIG. 6 is an example of a graph in which the optimum plate thickness t of the beam adjustment diaphragm plate 130 is obtained by using the above-described relational expression. The graph of FIG. 6 illustrates the calculation result when the radiation angle current density J is 250 [A/Sr], the radius r of the diaphragm hole 134 is 10 [µm], the radius r' from the center axis of the electron beam irradiated to the upper surface of the beam adjustment diaphragm plate 130 is 15 [µm], the distance from the crossover 502 to the diaphragm upper surface is 100 [µm], and the decay constant λ is 0.5, as examples of the parameters obtained from the experiment in which a specific acceleration voltage condition was used. From the calculation result of FIG. 6, it is possible to obtain the diaphragm plate thickness such that the total amount of the current amount generated by the transmitted electrons and the current amount generated by the scattered electrons is minimized. It can be seen that the plate thickness of the optimum diaphragm plate under this condition is approximately 7 µm.

FIG. 7 illustrates an embodiment related to the beam adjustment diaphragm plate.

A beam adjustment diaphragm plate unit 700 illustrated in FIG. 7 is configured with an XY 2-axis electric stage on which a plurality of diaphragm plates having different plate thicknesses are mounted. A Y stage 702 is attached to a stage base 703. On the Y stage 702, an X stage 501 that operates in a direction perpendicular to the Y stage is attached. On the X stage 701, three diaphragm plates 704, 705, and 706 having three types of plate thicknesses $t_1$, $t_2$, and $t_3$ are attached via a diaphragm plate base 709. The diaphragm plates 704 to 706 are each provided with a plurality of diaphragm holes having different hole diameters. The beam adjustment diaphragm plate unit 700 can move the diaphragm plates 704 to 706 to any position in an X direction 707 and a Y direction 708 by the X stage 701 and the Y stage 702. Further, the diaphragm plate base 709, the X stage 701, the Y stage 702, and the stage base 703 are configured such that a space is created under the diaphragm plates 704 to 706 in order to ensure a path through which the electron beam 107 passing through each diaphragm hole of the diaphragm plates 704 to 706 reaches the sample 112 (not illustrated). Further, the X stage 701 and the Y stage 702 are operated by an actuator (not illustrated) for driving the stage and an encoder (not illustrated) for position monitoring.

FIG. 8 illustrates a schematic configuration of an SEM type length measurement system (charged particle beam system) 800 equipped with the beam adjustment diaphragm plate unit 700 illustrated in FIG. 7. Since each component other than the beam adjustment diaphragm plate unit 700 in the charged particle beam system 800 is the same as those in FIG. 1, the detailed description thereof will be omitted here.

FIG. 9 illustrates a flow chart for creating the diaphragm plate selection table in the charged particle beam system 800 of FIG. 8.

In the following, the processing of each step will be described with "computer system" as the subject (operating subject), but the overall control unit 102 (or processor) may be used as the subject (operating subject) in the description and "various programs" executed by the computer system may be used as the subject (acting subject) in the description. A part or the entirety of the program may be implemented on dedicated hardware or may be modularized.

Various programs may be installed in the computer system by a program distribution server or storage media.

The computer system 133 calculates in advance the plate thickness of the optimum diaphragm plate in the acceleration voltage range of the usable electron beam 107 by using the above-described Equations 1 to 5 (901). From the calculation result, the computer system 133 creates a diaphragm plate selection table 904 illustrating the optimum correspondence relationship between the acceleration voltage and each diaphragm plate (902), and stores the diaphragm plate selection table 904 in the storage unit 105 (903). As described in FIG. 4, the diaphragm plate selection table 904 is created in a form having the correspondence relationship in which the plate thickness of the beam adjustment diaphragm plate increases when the acceleration voltage of the electron beam increases, and the plate thickness of the beam adjustment diaphragm plate decreases when the acceleration voltage of the electron beam decreases. In the flow chart illustrated in FIG. 9, another computer system may execute a step of calculating the plate thickness of the optimum diaphragm plate (901) and a step of creating the diaphragm plate selection table 904 (902), and the computer system 133 may store the diaphragm plate selection table 904 in the storage unit 105 (903).

FIG. 21 is a diagram illustrating an example of the diaphragm plate selection table.

The diaphragm plate selection table 904 is configured such that the diaphragm plates having the optimum plate thicknesses of $t_1$, $t_2$, and $t_3$ correspond to the three types of acceleration voltages 25, 35, and 45 [kV], respectively. For example, the computer system 133 selects the diaphragm plate having the plate thickness $t_3$ when an acceleration voltage of 45 [kV] is input (set) from the input/output unit 104.

FIG. 22 is a diagram illustrating another example of a diaphragm plate selection table 905.

The diaphragm plate selection table 905 is configured so as to achieve correspondence of each of a diaphragm plate having the plate thickness $t_1$ when the acceleration voltage is less than 30 [kV] (V<30 [kV]), a diaphragm plate having the plate thickness $t_2$ when the acceleration voltage is 30 [kV] or more and less than 40 [kV] (30≤V<40 [kV]), and a diaphragm plate having the plate thickness $t_3$ when the acceleration voltage is 40 [kV] or more (V≥40 [kV]). For example, the computer system 133 selects the diaphragm plate having the plate thickness $t_3$ when an acceleration voltage of 40 [kV] is input (set) from the input/output unit 104.

FIG. 10 illustrates a flow chart for determining the beam adjustment diaphragm plate having an optimum plate thickness and executing the positioning adjustment of the diaphragm hole, in the charged particle beam system 800 of FIG. 8. With respect to the acceleration voltage set (changed) by the input/output unit 104 (for example, from a graphical user interface) (1001), the computer system 133 refers to the diaphragm plate selection table stored in the storage unit 105 (1002), and determines the diaphragm plate having the optimum plate thickness from the diaphragm plates 704 to 706 (1003). In other words, the process executed in the steps 1003 to 1003 can also be called a process in which the computer system 133 performs control to select a beam adjustment diaphragm plate having a thick plate thickness when the acceleration voltage is changed in a direction of increasing with respect to a current value, and to select a beam adjustment diaphragm plate having a thin plate thickness when the acceleration voltage is changed in a direction of decreasing with respect to the current value. Otherwise, the computer system 133 can also be called a system that performs control to select a diaphragm plate having a thick plate thickness from among the diaphragm plates having a thin plate thickness (or select a diaphragm plate having a thin plate thickness from among the diaphragm plates having a thick plate thickness) according to the increase or decrease of the input (set) acceleration voltage. After this, the computer system 133 controls the X stage 701 and the Y stage 702 in the beam adjustment diaphragm plate unit 700, and performs the positioning adjustment of a desired diaphragm hole in the determined diaphragm plate (1004). After the positioning adjustment of the diaphragm hole, the computer system 133 confirms whether or not the optical axis deviation is within the specifications (1005), ends the flow when the optical axis deviation is within the specifications, and performs positioning readjustment of the diaphragm hole when the optical axis deviation is out of the specifications (1004).

FIG. 11 illustrates another embodiment related to the beam adjustment diaphragm plate.

A beam adjustment diaphragm plate unit 1100 illustrated in FIG. 11 has a structure in which a disk-shaped beam adjustment diaphragm plate 1101 having a plurality of diaphragm holes 1107 is connected to a motor 1103 via a rotating shaft 1102. Further, the motor 1103 is attached to an r-axis electric stage 1104. The disk-shaped beam adjustment diaphragm plate 1101 has a plurality of regions having different thicknesses (for example, thicknesses $t_1$, $t_2$, and $t_3$) for each predetermined rotation angle in a θ direction 1106, and a plurality of diaphragm holes 1107 having different hole diameters are formed in each region having different thicknesses. The disk-shaped beam adjustment diaphragm plate 1101 can be rotated in the θ direction 1106 by the motor 1103, and the r stage 1104 operates in an r direction 1105 by an actuator (not illustrated) for driving the stage and an encoder (not illustrated) for position monitoring.

In the SEM type length measurement system (charged particle beam system) 800 of FIG. 8, even when the beam adjustment diaphragm plate unit 1100 illustrated in FIG. 11 is adopted instead of the beam adjustment diaphragm plate unit 700 illustrated in FIG. 7, it is possible to create a diaphragm plate thickness selection table 1110 according to the flow chart described in FIG. 9. Similarly, it is also possible to determine the diaphragm hole having the optimum plate thickness according to the flow chart described in FIG. 10 (1003). After determining the diaphragm hole having the optimum plate thickness, the computer system 133 controls the motor 1103 and the r stage 1104 in the beam adjustment diaphragm plate unit 1100 to perform the positioning adjustment of the diaphragm hole determined with respect to the optical axis 1108 (1004), and performs confirmation of the optical axis deviation (1005).

According to the present Example 1, even when the electron beam is changed within a wide acceleration voltage range of several hundreds of V to several tens of kV, it is possible to suppress the influence of flare of which the state differs depending on the acceleration voltage, and to acquire a high-resolution image (SEM image) at each acceleration voltage.

EXAMPLE 2

In the technology using the beam adjustment diaphragm plate of the related art, when the acceleration voltage of the electron beam is changed within a wide range of several hundreds of V to several tens of kV to acquire a high-resolution SEM image, the following second problem occurs with the switching of the acceleration voltage.

In other words, as the acceleration voltage of the electron beam is switched, the current amount of the electron beam irradiated to the beam adjustment diaphragm plate changes, and accordingly, there is a problem that the temperature of the beam adjustment diaphragm plate changes and a change (drift) of the diaphragm plate over time occurs. In particular, when the acceleration voltage of the electron beam is significantly changed, the thermal energy generated by the electron beam irradiated onto the diaphragm plate changes significantly, and the expansion and contraction of the diaphragm plate remarkably occur (for example, in JP-A-6-163371 (PTL 3), such problems are described). For example, when the acceleration voltage increases by $\Delta V$, a heat quantity $\Delta Q$ generated per unit time in the beam adjustment diaphragm plate is expressed as illustrated in Equation 6 assuming that the current amount of the electron beam irradiated onto the diaphragm plate is I.

$$\Delta Q = I \cdot \Delta V \qquad \text{[Equation 6]}$$

In this case, the temperature of the beam adjustment diaphragm plate rises due to the generation of the heat quantity $\Delta Q$, and the diaphragm plate thermally expands. When such a change (drift) of the beam adjustment diaphragm plate over time occurs, an event such as a change in the state of the main beam and a change in the optical axis of the capturing tool 101 occurs, and thus, there is a problem that a change in device performance over time and a difference between the devices occurs.

The above-described problems can be solved by the aspect of Example 2 illustrated in the present disclosure.

FIG. 12 illustrates a schematic configuration of the SEM type length measurement system (charged particle beam system) according to Example 2.

In order to solve the above-described second problem, in an SEM type length measurement system 1200 illustrated in FIG. 12, above the beam adjustment diaphragm plate unit 1100 of FIG. 11 described above, a beam cut diaphragm unit 1300 that blocks a part of the electron beam 107 is newly disposed. FIG. 12 illustrates an enlarged view of the components of the beam adjustment diaphragm plate unit 1100 and the beam cut diaphragm unit 1300, and FIG. 13 illustrates a schematic view of the structure of the beam cut diaphragm unit 1300.

The beam cut diaphragm unit 1300 illustrated in FIG. 13 has a structure in which a disk-shaped beam cut diaphragm plate 1301 having a plurality of diaphragm holes 1307 is connected to a motor 1303 via a rotating shaft 1302. Further, the motor 1303 is attached to an r-axis electric stage 1304. The disk-shaped beam cut diaphragm plate 1301 has a uniform plate thickness, and a plurality of diaphragm holes 1307 having different hole diameters are formed. The disk-shaped beam cut diaphragm plate 1301 can be rotated in a θ direction 1306 by the motor 1303, and the r stage 1304 operates in an r direction 1305 by an actuator (not illustrated) for driving the stage and an encoder (not illustrated) for position monitoring. The shape of each of the plurality of diaphragm holes 1307 is circular.

FIG. 14 is a view illustrating the relationship of the beam adjustment diaphragm plate 1101 of the beam adjustment diaphragm plate unit 1100, the beam cut diaphragm plate 1301 of the beam cut diaphragm unit 1300, and the electron beam 107. Here, it is assumed that the electron beam 107 focused on a predetermined crossover (focusing point) 1401 by the first focusing lens 108 spreads at an emission angle ϕ and travels toward the sample 112. At this time, the diaphragm hole 1307 and the diaphragm hole 1107 are combined such that a hole diameter $\phi_2$ of the diaphragm hole 1307 of the diaphragm plate 1301 is greater than a hole diameter $\phi_3$ of the diaphragm hole 1107 of the diaphragm plate 1101 (such that $\phi_2 > \phi_3$), and accordingly, a part of the electron beam 107 can be cut (blocked), and the current amount of the electron beam 107 irradiated to the upper surface of the diaphragm plate 1101 can be reduced. In other words, in the configuration without the beam cut diaphragm plate 1301, all the electron beams that do not pass through the diaphragm hole 1107 need to be cut by the beam adjustment diaphragm plate 1101, and thus, the influence of the change in thermal energy (change in current amount) due to the change in acceleration voltage of the electron beam is easily received, and the expansion and contraction of the beam adjustment diaphragm plate 1101 remarkably occur. On the other hand, the newly added beam cut diaphragm plate 1301 cuts (blocks) the electron beam (the electron beam irradiated to the region other than the diaphragm hole 1107) irradiated to the upper surface of the beam adjustment diaphragm plate 1101 as much as possible, and accordingly, it is possible to reduce the influence of the change in thermal energy due to the change in acceleration voltage of the electron beam as much as possible, and to reduce the expansion and contraction of the beam adjustment diaphragm plate 1101.

In the beam cut diaphragm plate 1301, by cutting the electron beam irradiated to the region (the upper surface of the beam adjustment diaphragm plate 1101) other than the diaphragm hole 1107 of the beam adjustment diaphragm plate 1101 as much as possible, it is possible to reduce the current amount (thermal energy) of the electron beam 107 irradiated to the upper surface of the diaphragm plate 1101 as much as possible. When the hole diameter $\phi_2$ of the diaphragm hole 1107 of the beam adjustment diaphragm plate 1101 to be used is determined, the optimum hole diameter $\phi_3$ of the beam cut diaphragm plate 1301 can be obtained, for example, as follows. Assuming that the distance from the crossover 1402 to the upper surface of the beam cut diaphragm plate 1301 is L and the distance from the crossover 1402 to the upper surface of the beam adjustment diaphragm plate 1101 is H, the optimum hole diameter $\phi_3$ can be expressed as in Equation 7.

$$\phi_3 = \phi_2 \times (L/H) \qquad \text{[Equation 7]}$$

Using Equation 7, the hole diameter $\phi_3$ of the optimum diaphragm hole 1307 is obtained in advance according to the hole diameter $\phi_2$ of the selectable diaphragm hole 1107, and the optimum combination of $\phi_2$ and $\phi_3$ can be stored in the storage unit 105 as a beam cut diaphragm hole selection table 1504.

FIG. 15 illustrates a flow chart for creating the beam cut diaphragm hole selection table in the SEM type length measurement system (charged particle beam system) 1200 of FIG. 12. The computer system 133 calculates in advance the hole diameter $\phi_3$ of the diaphragm hole 1307 of the optimum beam cut diaphragm plate 1301 with respect to the hole diameter $\phi_2$ of the diaphragm hole 1107 of the beam adjustment diaphragm plate 1101 that can be used, by using the above-described Equation 7 (1501). From the calculation result, the computer system 133 creates the beam cut diaphragm hole selection table 1504 illustrating the optimum correspondence relationship between the hole diameter $\phi_2$ and the hole diameter $\phi_3$ (1502), and stores the beam cut diaphragm hole selection table 1504 in the storage unit 105 (1503). Otherwise, another computer system may execute a step of calculating the hole diameter $\phi_3$ of the optimum diaphragm hole 1307 (1501) and a step of creating the beam cut diaphragm hole selection table 1504 (1502), and the computer system 133 may store the beam cut diaphragm hole selection table 1504 in the storage unit 105 (1503).

FIG. 23 is a diagram illustrating an example of the beam cut diaphragm hole selection table 1504.

The beam cut diaphragm hole selection table 1504 is configured such that the beam cut diaphragm holes 1307 having the optimum hole diameters of X, Y, and Z correspond to the hole diameters A, B, and C of the three types of beam adjustment diaphragm holes 1107, respectively. For example, when the beam adjustment diaphragm hole 1107 having the hole diameter A is input (set) from the input/output unit 104, the computer system 133 selects the beam cut diaphragm hole 1307 having the hole diameter X.

FIG. 16 illustrates a flow chart for determining the hole diameter of the optimum beam cut diaphragm hole and executing the positioning adjustment of the diaphragm hole, in the SEM type length measurement system (charged particle beam system) 1200 of FIG. 12. With respect to the hole diameter $\phi_2$ of the beam adjustment diaphragm hole set (selected) by the input/output unit 104 (1601), the computer system 133 refers to the beam cut diaphragm hole selection table 1504 stored in the storage unit 105 (1602), and determines the diaphragm hole having the optimum hole diameter $\phi_3$ from among the plurality of diaphragm holes 1307 formed on the beam cut diaphragm plate 1301 (1603). The computer system 133 controls the motor 1103, the r stage 1104, the motor 1303, and the r stage 1304 in the beam adjustment diaphragm plate unit 1100 and the beam cut diaphragm unit 1300, and performs the positioning adjustment of the set beam adjustment diaphragm hole and the determined beam cut diaphragm hole (1604). After the positioning adjustment of the both of the diaphragm holes, the computer system 133 confirms whether or not the optical axis deviation is within the specifications (1605), ends the flow when the optical axis deviation is within the specifications, and performs positioning readjustment of the diaphragm hole when the optical axis deviation is out of the specifications (1604).

According to the embodiment of the above-described disclosure, even when the acceleration voltage of the electron beam is changed, it is possible to reduce the change over time due to the expansion and contraction of the beam adjustment diaphragm plate, and thus, an SEM with little change in the device performance over time and little difference between the devices can be realized.

In the beam cut diaphragm hole selection table 1504 of the above-described embodiment, an example in which a table for determining the hole diameter of the optimum beam cut diaphragm hole with respect to the set hole diameter of the beam adjustment diaphragm hole is created in advance.

As another embodiment of the beam cut diaphragm hole selection table, a case is considered in which a table for determining the hole diameter of the optimum beam cut diaphragm hole with respect to the setting of the optical conditions of the SEM type length measurement system 1200 is created in advance. For example, when the hole diameter of the beam cut diaphragm hole is calculated and obtained in advance in which the current amount (thermal energy) of the electron beam irradiated to the upper wall surface of the beam adjustment diaphragm plate 1101 is always constant, with respect to the setting (change) of the acceleration voltage of the electron beam 107, and is stored in the storage unit 105 as the beam cut diaphragm hole selection table 1700, even in a case where the setting of the acceleration voltage of the electron beam 107 is changed, it is possible to reduce deformation such as expansion and contraction of the beam adjustment diaphragm plate 1101. The beam cut diaphragm hole selection table 1700 can be created by the same flow chart as that in FIG. 15.

FIG. 17 illustrates a flow chart when the diaphragm plate selection table 1110 and the beam cut diaphragm hole selection table 1700 are used in the SEM type length measurement system (charged particle beam system) 1200 of FIG. 12. With respect to the acceleration voltage set (changed) by the input/output unit 104 (1701), the computer system 133 refers to the diaphragm plate thickness selection table 1110 stored in the storage unit 105 (1702), and determines the diaphragm hole 1107 having the optimum plate thickness from among the plurality of diaphragm holes formed on the diaphragm plate 1101 (1703). Similarly, with respect to the acceleration voltage of the electron beam set (changed) by the input/output unit 104, the computer system 133 refers to the beam cut diaphragm hole selection table 1700 stored in the storage unit 105 (1704), and determines the diaphragm hole having the optimum hole diameter $\phi_3$ from among the plurality of diaphragm holes 1307 formed on the beam cut diaphragm plate 1301 (1705). Since the subsequent steps are the same as those in FIG. 16, the detailed description thereof will be omitted here.

According to the present Example 2, even when the acceleration voltage of the electron beam is changed (switched), it is possible to suppress the drift over time due to the change in heat quantity of the beam adjustment diaphragm plate, and a length measuring SEM with little change in device performance over time and little difference between the devices can be realized.

EXAMPLE 3

In the disclosure according to Example 1, an example is illustrated in which the total number of the number of electrons transmitted through the beam adjustment diaphragm plate and the number of electrons scattered at the side wall portion of the diaphragm hole of the beam adjustment diaphragm plate can be minimized by using a combination of beam adjustment diaphragm plates having the optimum plate thickness for the desired acceleration voltage of the electron beam. However, in the disclosure according to Example 1, since these transmitted electrons and scattered electrons cannot be completely excluded, the influence of flare on the resolution of the SEM image cannot be eliminated.

Therefore, in the present Example, as illustrated in FIG. 18, an energy filter 1801 for cutting the transmitted electrons and scattered electrons is disposed below the beam adjustment diaphragm plate. The SEM type length measurement system (charged particle beam system) 1800 of FIG. 18 is an example in which the energy filter 1801 is added to the SEM type length measurement system illustrated in FIG. 12.

FIG. 19 illustrates a detailed view of the periphery of the beam adjustment diaphragm plate 1101 and the energy filter 1801. The energy filter 1801 is formed in a grid pattern by a non-magnetic metal wire such as copper. Further, any voltage can be applied to the energy filter 1801 by a power source 1903. Electrons 1901 that have passed through the predetermined diaphragm hole 1107 in the beam-adjusting diaphragm plate 1101 and electrons 1902 that have been scattered at the side wall portion of the diaphragm hole 1107 of the beam adjustment diaphragm plate 1101 lose the energy of the electrons themselves in the process of transmission and scattering, and thus, the electrons 1901 and 1902 have lower energy than that of the electrons of the main beam (the beam that has passed through the diaphragm hole 1107 of the beam adjustment diaphragm plate 1101). In the present Example, this energy difference is used to discriminate the main beam and the transmitted and scattered electrons. In other words, the computer system 133 applies an appropriate negative voltage to the energy filter 1801 and performs control such that only the transmitted and scattered electrons having lower energy than that of the electrons of the main beam are repelled upward.

The optimum negative voltage to be applied to the energy filter 1801 is obtained by calculation or experiment in advance according to the acceleration voltage of the electron beam to be used, and the optimum combination of the acceleration voltage and the applied voltage can be stored in the storage unit 105 in advance as the energy filter applied voltage table 2000.

FIG. 24 is a diagram illustrating an example of the energy filter applied voltage table 2000.

The energy filter applied voltage table 2000 is configured such that the optimum energy filter applied voltages of $V_1$, $V_2$, and $V_3$ correspond to the three types of acceleration voltages 25, 35, and 45 [kV], respectively. For example, the computer system 133 selects the applied voltage of the energy filter having the plate thickness $V_3$ when an acceleration voltage of 45 [kV] is input (set) from the input/output unit 104.

FIG. 20 illustrates a flow chart when the diaphragm plate selection table 1110, the beam cut diaphragm hole selection table 1700, and the energy filter applied voltage table 2000 are used in the SEM type length measurement system (charged particle beam system) 1800 of FIG. 18. Since the flow of steps 1701 to 1707 is the same as that of FIG. 18, the detailed description thereof will be omitted here. After executing the steps 1701 to 1706, when the optical axis deviation is within the specifications (1707), with respect to the acceleration voltage set (changed) by the input/output unit 104, the energy filter applied voltage table 2000 stored in the storage unit 105 is referred to (2001), and the optimum applied voltage for discriminating only the transmitted and scattered electrons is determined (2002).

According to the present Example 3, since it is possible to further suppress the influence of flare by discriminating between the main beam and the transmitted and scattered electrons, even when the electron beam is changed within a wide acceleration voltage range of several hundreds of V to several tens of kV, it is possible to realize a higher resolution of the image (SEM image) at each acceleration voltage. Further, according to the present Example 3, since it is possible to suppress the drift over time of the beam adjustment diaphragm plate, a length measuring SEM with little change in device performance over time and little difference between the devices can be realized.

Above, while the embodiments of the present invention have been described, these embodiments have been presented by way of example only, and are not intended to limit the scope of the inventions. The novel embodiments described herein may be embodied in a variety of other forms, and various omissions, substitutions and changes may be made without departing from the spirit of the invention. Such embodiments or modifications thereof are included within the scope and spirit of the invention, and within the scope equivalent to that of the invention described in the scope of the claims.

REFERENCE SIGNS LIST

100: SEM type length measurement system (charged particle beam system)
101: beam irradiation system (capturing tool)
102: overall control unit
103: signal processing unit
104: input/output unit
105: storage unit
106: electron gun
107: electron beam
108: first focusing lens
109: second focusing lens
110: deflector
111: objective lens
112: sample
113: stage
114: emitted electron
115: deflector
116: detection diaphragm
119: detector
120:
121: detector
122: energy filter
123: deflector
130: beam adjustment diaphragm plate
131: blanking deflector
132: Faraday cup
133: computer system

The invention claimed is:

1. A charged particle beam system having a computer system for controlling an acceleration voltage of a charged particle beam emitted from a charged particle source, the system comprising:
a first diaphragm group having first and second diaphragms which are diaphragms that act on the charged particle beam and have different thicknesses; and
a first diaphragm switching mechanism for switching the diaphragm in the first diaphragm group, wherein
the computer system controls the first diaphragm switching mechanism so as to switch from the first diaphragm to the second diaphragm according to an increase or decrease of the acceleration voltage.

2. The charged particle beam system according to claim 1, wherein
the first diaphragm group is formed on a first disc-shaped diaphragm plate.

3. The charged particle beam system according to claim 2, wherein
the first diaphragm switching mechanism is configured such that the first disc-shaped diaphragm plate rotates.

4. The charged particle beam system according to claim 2, wherein
the first disc-shaped diaphragm plate is made of the same metal material.

5. The charged particle beam system according to claim 1, wherein
the computer system obtains in advance first relationship information indicating a correspondence relationship between the first and second diaphragms and the acceleration voltage, and controls the first diaphragm switching mechanism so as to switch from the first diaphragm to the second diaphragm based on the first relationship information and the increase or decrease of the acceleration voltage.

6. The charged particle beam system according to claim 1, wherein
the computer system controls the first diaphragm switching mechanism based on the acceleration voltage input from a graphical user interface.

7. The charged particle beam system according to claim 1, further comprising:
- a second diaphragm group having third and fourth diaphragms which are diaphragms that act on the charged particle beam and have different hole diameters; and
- a second diaphragm switching mechanism for switching the diaphragm in the second diaphragm group, wherein
- the computer system controls the second diaphragm switching mechanism according to the hole diameters of the first diaphragm or the second diaphragm.

8. The charged particle beam system according to claim 7, wherein
- the computer system obtains in advance second relationship information indicating the correspondence relationship between the hole diameter of the first diaphragm or the second diaphragm and the third and fourth diaphragms, and controls the second diaphragm switching mechanism so as to switch from the third diaphragm to the fourth diaphragm based on the second relationship information and the hole diameter of the first diaphragm or the second diaphragm.

9. The charged particle beam system according to claim 1, further comprising:
- an energy filter that is disposed between a sample and the first diaphragm group and acts on the charged particle beam, wherein
- the computer system controls an applied voltage applied to the energy filter according to the hole diameter of the first diaphragm or the second diaphragm.

10. The charged particle beam system according to claim 9, wherein
- the computer system obtains in advance third relationship information indicating a correspondence relationship between the hole diameter of the first diaphragm or the second diaphragm and the applied voltage, and controls the applied voltage applied to the energy filter based on the third relationship information and the hole diameter of the first diaphragm or the second diaphragm.

* * * * *